(12) United States Patent
Higashi et al.

(10) Patent No.: US 7,410,857 B2
(45) Date of Patent: Aug. 12, 2008

(54) SEMICONDUCTOR MEMORY DEVICE AND MANUFACTURING METHOD THEREOF

(75) Inventors: Masahiko Higashi, Aizuwakamatsu (JP); Manabu Nakamura, Aizuwakamatsu (JP); Kentaro Sera, Aizuwakamatsu (JP); Hiroyuki Nansei, Aizuwakamatsu (JP); Yukihiro Utsuno, Aizuwakamatsu (JP); Hideo Takagi, Aizuwakamatsu (JP); Tatsuya Kajita, Aizuwakamatsu (JP)

(73) Assignee: Spansion LLC., Sunnyvale, CA (US)

( * ) Notice: Subject to any disclaimer, the term of this patent is extended or adjusted under 35 U.S.C. 154(b) by 0 days.

(21) Appl. No.: 11/878,296

(22) Filed: Jul. 23, 2007

(65) Prior Publication Data

US 2007/0262374 A1  Nov. 15, 2007

Related U.S. Application Data

(60) Division of application No. 11/065,305, filed on Feb. 25, 2005, now Pat. No. 7,253,046, which is a continuation of application No. PCT/JP03/11109, filed on Aug. 29, 2003.

(30) Foreign Application Priority Data

Aug. 30, 2002  (JP) .............................. 2002-255528

(51) Int. Cl.
  *H01L 21/8238* (2006.01)
(52) U.S. Cl. ...................... 438/216; 438/261; 438/591; 438/593; 257/324; 257/E29.309

(58) Field of Classification Search ................. 438/216, 438/261, 287, 288, 591, 593, 769–772, 775–777, 438/786–788, 791, 954; 257/324, E29.309
See application file for complete search history.

(56) References Cited

U.S. PATENT DOCUMENTS 7,253,046 B2 *  8/2007  Higashi et al. .............. 438/216

(Continued)

FOREIGN PATENT DOCUMENTS

JP          52-058489          5/1977

(Continued)

OTHER PUBLICATIONS

Lusky et al; "Characterization of Channel Hot Electron Injection by the Subthreshold Slope of NROM™ Device;" IEEE Electron Device Letters, vol. 22, No. 11 (Nov. 2001) 556-558.

(Continued)

*Primary Examiner*—Thien F Tran
(74) *Attorney, Agent, or Firm*—Kratz, Quintos & Hanson, LLP.

(57) ABSTRACT

After an ONO film in which a silicon nitride film (22) formed by a plasma nitriding method using a plasma processor having a radial line slot antenna is sandwiched by silicon oxide films (21), (23), a bit line diffusion layer (17) is formed in a memory cell array region (11) by an ion implantation as a resist pattern (16) taken as a mask, then lattice defects are given to the silicon nitride film (22) by a further ion implantation. Accordingly, a highly reliable semiconductor memory device can be realized, in which a high quality nitride film is formed in a low temperature condition, in addition, the nitride film can be used as a charge trap film having a charge capture function sufficiently adaptable for a miniaturization and a high integration which are recent demands.

11 Claims, 15 Drawing Sheets

U.S. PATENT DOCUMENTS

2002/0000592 A1    1/2002    Fujiwara .................... 257/296

FOREIGN PATENT DOCUMENTS

| JP | 58-023482 | 2/1983 |
| JP | 58-093289 | 6/1983 |
| JP | 01-201965 | 8/1989 |
| JP | 2001-093995 | 4/2001 |
| WO | WO 99/60631 | 11/1999 |

OTHER PUBLICATIONS

International Search Report dated Dec. 2, 2003.

* cited by examiner

SEMICONDUCTOR MEMORY DEVICE AND MANUFACTURING METHOD THEREOF

CROSS REFERENCE TO RELATED APPLICATION

This application is a division of Ser. No. 11/065,305, filed Feb. 25, 2005 now U.S. Pat. No. 7,253,046, which is a continuation of international application No. PCT/JP03/11109 filed Aug. 29, 2003, which is based on Japanese Application No. 2002-255528 filed Aug. 30, 2002.

TECHNICAL FIELD

The present invention relates to a semiconductor memory device and a manufacturing method thereof, which has a gate insulating film including a nitride film and capable of holding information by storing the charge in the nitride film.

BACKGROUND ART

In recent years, a multitude of so-called flash memories are used as a rewritable semiconductor memory device. The flash memory using a floating gate prevails among them, however, it is difficult for the memory of this type to allow a tunnel insulating film to be thinner, which is an obstacle for the mass storage. Hence, a multi-value memory cell is thought out, in which a threshold value of a transistor is varied by controlling a charge amount to the floating gate when writing, and multi-value data is allowed to be stored in one memory cell.

A new multi-value memory cell having an MNOS structure or a SONOS structure, different from the floating gate type memory cell, is proposed, which applies, to the gate insulating film just under a gate electrode, a two-layered structure of an oxide film/an nitride film (ON), namely, the structure that the nitride film is stacked on the oxide film as seen from a substrate, or a three-layered structure of the oxide film/the nitride film/the oxide film (ONO), namely, the structure that the nitride film and the oxide film are sequentially stacked on the oxide film seen from the substrate, and which stores the charge locally in the nitride film in the vicinity of respective source/drain of the transistor, resultingly storing 2-bits data with respect to one memory cell.

Such multi-value memory cell has a simpler structure than that of the floating gate-type memory cell, and has an advantage that a cell area per bit is about ½, compared with the floating-gate type memory cell. And further, a memory cell having a memory cell array structure and being advantageous to a miniaturization are studied, which does not have a contact hole for a bit line in each transistor even though it is a NOR type memory, by using a source/drain as a bit line (an embedded bit line), namely, by forming the bit line under a word line.

In the memory cell having the aforementioned MNOS structure or SONOS structure, in order to form the gate insulating film, first, after a thin lower oxide film (tunnel oxide film) having a film thickness of approximately 7 nm is formed by a thermal oxidation method, a nitride film having a film thickness of approximately 10 nm is deposited by a CVD method to form an ON film. In the case of the SONOS structure, an upper oxide film is further formed by thermally oxidizing an upper portion of the nitride film to form an ONO film in which the nitride film is sandwiched between upper and lower oxide films.

When the above-mentioned nitride film is formed by the CVD method, a heat of approximately 650° C. to 850° C. is applied. And further, in order to form the upper oxide film by the thermal oxidation of the nitride film, a heat treatment of 1000° C. or more is required. In addition, in order to form the high-quality lower oxide film, a temperature condition of 900° C. or more is required.

Accordingly, in order to form the ON film or the ONO film by the CVD method, there exists a problem that the high temperature heat treatment for a long time is fundamental and that a matching property is extremely low with respect to the miniaturization of a semiconductor element, especially a transistor, of a peripheral circuit region of a memory cell. In addition, in the memory cell structure to which an embedded bit line is used, an impurity of the bit line is diffused by the high temperature heat treatment. If the bit line is formed after the ON film or the ONO film is formed to avoid the diffusion, there is a problem that damage is generated in the ON film or the ONO film and the decrease of a withstand voltage is caused.

Since the nitride film (CVD nitride film) formed by the CVD method has many N holes constituting charge trap centers, the film is used for a charge trap film of the transistor of the MNOS structure or the SONOS structure and the like. However, the formation of the CVD nitride film requires the high temperature as described above, and further, in the case of the highly integrated MNOS structure or the SONOS structure and the like which stores 2 bits per cell by performing a charge injection only to respective edge portions of the source/drain switched between a read-out occasion and a rewrite occasion, the charge trap centers exist at portions where the charge injection is desired to be avoided in the nitride film in which the N holes are formed almost uniformly such as the CVD nitride film, so that inconvenience for a device operation is caused.

For example, if electrons are injected and stored to portions other than portions to which electrons or holes are injected and stored in the nitride film (in the vicinity of the edge of the drain), especially the center portion of a channel, there exists a problem that a threshold value of the transistor increases and a margin in the low state of threshold value decreases regardless of the injection state of the electrons or holes to the vicinity of the edge of the drain.

The present invention is made in view of the above problems and an object thereof is to provide a highly reliable semiconductor memory device and a manufacturing method thereof, in which a high quality nitride film is formed in a low temperature condition, in addition, the nitride film can be used as a charge trap film having a charge capture function sufficiently adaptable for a miniaturization and a high integration which are recent demands.

SUMMARY OF THE INVENTION

As a result of repeating the earnest study, the present inventor thought out the following aspects of the present invention.

A semiconductor memory device of the present invention includes a semiconductor substrate, an insulating film formed on the semiconductor substrate and having a nitride film including a charge capture function, a gate electrode formed on the semiconductor substrate through the insulating film, and a pair of impurity diffusion layers formed on the semiconductor substrate, and the nitride film includes charge trap centers in which lattice defects are formed at a specified portion thereof.

A manufacturing method of a semiconductor memory device of the present invention includes the steps of forming an insulating film including a nitride film formed on a semiconductor substrate by a plasma nitriding method, forming a pair of impurity diffusion layers with an impurity introduced into a surface layer of the semiconductor substrate, forming charge trap centers with lattice defects given to portions corresponding to at least on the impurity diffusion layers in the nitride film before or after the formation of the impurity diffusion layer, and forming a gate electrode so as to cross the impurity diffusion layer through the insulating film.

Another aspect of the manufacturing method of the semiconductor memory device of the present invention includes the steps of forming an insulating film including a nitride film formed on a semiconductor substrate by a plasma nitriding method, forming a gate electrode on the insulating film, forming a pair of impurity diffusion layers with an impurity introduced into a surface layer of the semiconductor substrate with, at least, the gate electrode taken as a mask, and forming charge trap centers with lattice defects given to a portion corresponding to, at least, on the impurity diffusion layer in the nitride film with, at least, the gate electrode taken as a mask before or after the formation of the impurity diffusion layer.

In the aforementioned manufacturing method, the nitride film is formed by performing a nitriding processing with the plasma excited by a microwave in an atmosphere of a source gas including nitrogen atoms for generating a nitride radical.

In the aforementioned manufacturing method, the lattice defects are formed in the nitride film by introducing an impurity into the nitride film or performing a radio frequency processing using an inert gas.

DETAILED DESCRIPTION OF THE PREFERRED EMBODIMENTS

—Basic Gist of the Present Invention—

Figure 1A:
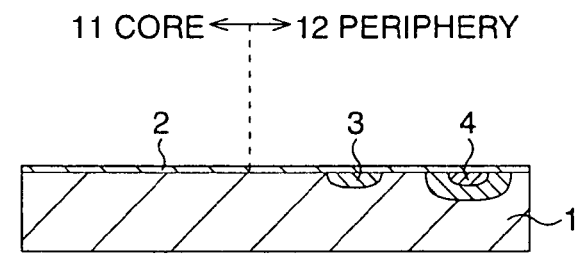
FIG. 1A to FIG. 1D are schematic sectional views showing a manufacturing method of a semiconductor memory device including an embedded bit line type SONOS transistor according to a first embodiment in order of process.

First, the basic gist of the present invention will be described.

In the present invention, in addition to manufacturing a semiconductor memory device in a low temperature condition through the entire manufacturing process, specifically, in the low temperature condition at 600° C. or less with respect to the processing having the heat for more than several minutes except the processing of rapid temperature increase and decrease within approximately one minute such as RTA and the like, in consideration of obtaining a dense and good quality nitride film (a charge trap film), a nitriding processing (a plasma nitriding method) using a nitride radical formed by excited plasma is employed instead of a CVD method requiring a high temperature, when the nitride film is formed. And further, not only the nitride film but also an oxide film under the nitride film in an ON film, and oxide films of upper and lower layers with respect to the nitride film in an ONO film are similarly formed by a plasma processing (a plasma oxidation method), so that the further reduction of thermal budget can be possible and a matching property with a peripheral circuit region is improved.

The plasma nitriding method is a method such that the nitriding processing is performed by generating the nitride radical (NH*radical or N*radical) with the plasma excided by a microwave in an atmosphere of a source gas including nitrogen atoms, for example, one kind selected from a $NH_3$ gas, a mixed gas of $N_2$ and $H_2$, and $N_2$ gas, or a mixed gas of the $NH_3$ gas and $N_2$ gas, or a mixed gas of the $NH_3$ gas, the $N_2$, and the $H_2$. According to this method, the dense and good quality plasma nitride film can be obtained at a low temperature of approximately 200° C. to 600° C. Though the plasma nitride film is formed by the plasma nitriding method alone or by a series of processes including the plasma nitriding method, in the following description, it will be written that it is formed "by the plasma nitriding method" for convenience.

Since the plasma nitriding film is the dense and good quality nitriding film, it has extremely little lattice defect in the whole surface, therefore it has little N hole, so that it is an excellent nitride film when used on a portion to which the charge storage is required to be avoided. At the same time, however, the film inevitably has a difficulty in storing the charge on a specified portion to which the charge storage is required (for example, the vicinity of the edge of a drain).

Considering that the charge storage is performed on the specified portion when the dense and good quality nitride film using the plasma nitriding method, the present inventor found out that charge trap centers are formed only on a specified portion by selectively giving lattice defects to the specified portion of the plasma nitride film, for example, to the vicinity of the edge of the drain, besides forming the nitride film by the plasma nitriding method. In this case, it goes without saying that the lattice defects can be given to the whole surface of the plasma nitride film.

As a method of giving the lattice defects to the specified portion of the plasma nitride film, to introduce an impurity to the specified portion by an ion implantation and to perform a radio frequency processing (RF processing) using an inert gas to the specified portion are effective. Specifically, a resist pattern having openings only at specified portions of the plasma nitride film is formed, and the ion implantation or the RF processing is performed using the resist pattern as a mask.

In this case, when a nitride film charge-storage memory including an embedded bit line type SONOS/SNOS/SNS transistors, i.e., including a source/drain used also for the embedded bit line and having a channel parallel to a word line (gate electrode) is fabricated, a resist pattern for forming the source/drain is also used as a mask. On the other hand, when a nitride film charge-storage memory including conventional MONOS/MNOS/MNS transistors, i.e., including the source/drain formed by a self-alignment with the word line (gate electrode), and having a channel vertical to the word line is fabricated, to use the gate electrode for forming the source/drain also as a mask is suitable because it leads to a reduction of processes.

Specific Embodiments

Based on the aforementioned basic gist of the present invention, specific embodiments will be described below.

First Embodiment

In the present invention, an embedded bit line type SONOS transistor as a semiconductor memory device will be disclosed. For convenience, a structure of the transistor will be explained with a manufacturing method thereof.

In the semiconductor memory device, a SONOS transistor in a memory cell array region is a planar type and a CMOS transistor is formed in a peripheral circuit.

Figure 1B:
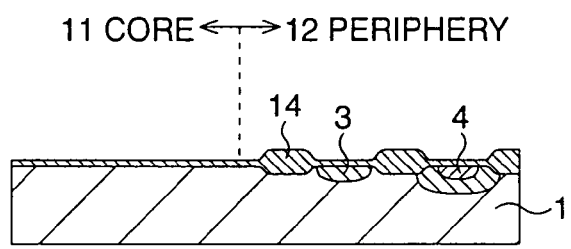
Figure 1C:
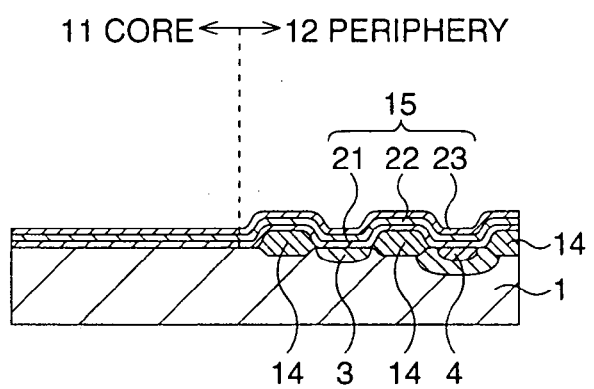
Figure 1D:
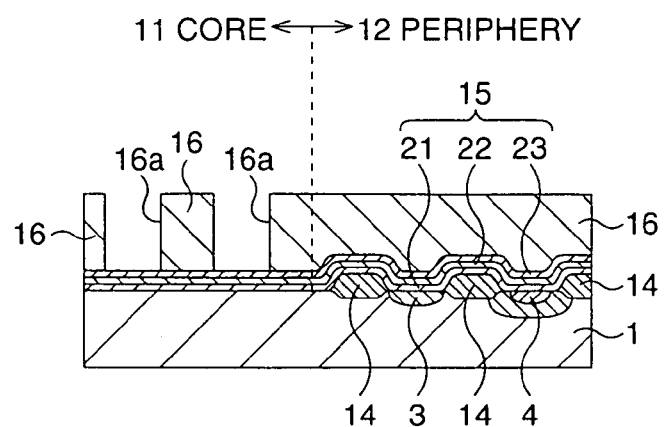
Figure 2A:
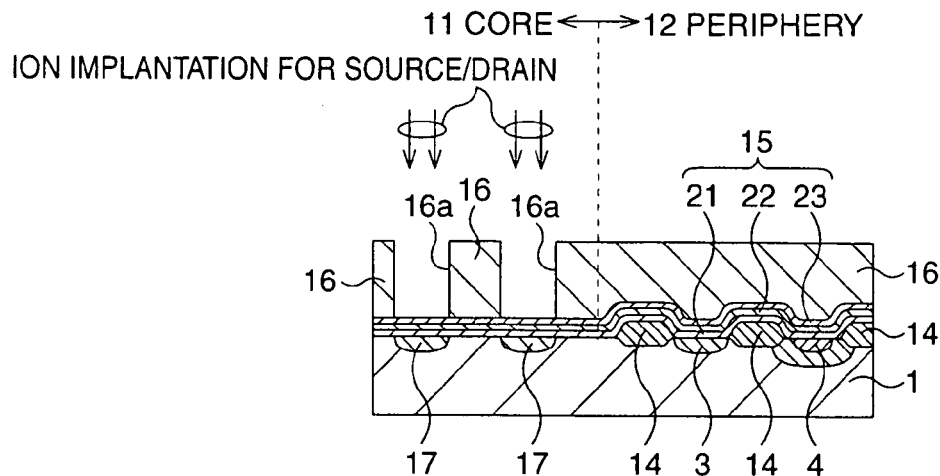
FIG. 2A to FIG. 2D are schematic sectional views showing the manufacturing method of the semiconductor memory device including the embedded bit line type SONOS transistor according to the first embodiment followed by FIG. 1D in order of process.
Figure 2B:
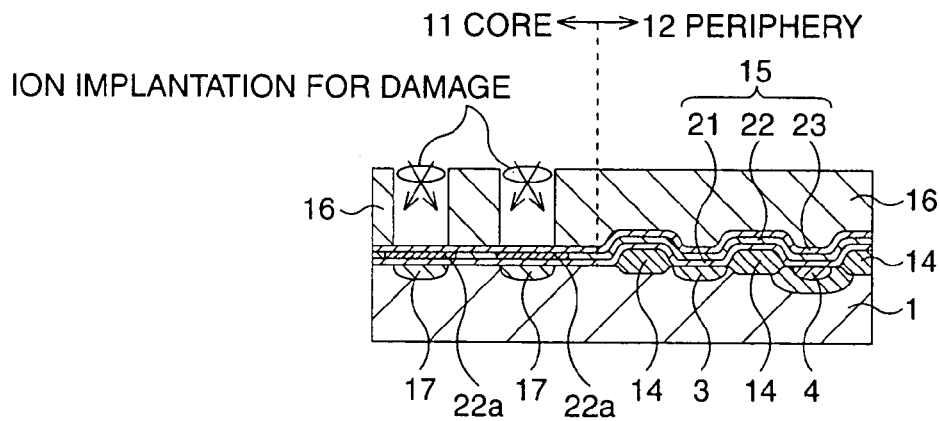
Figure 2C:
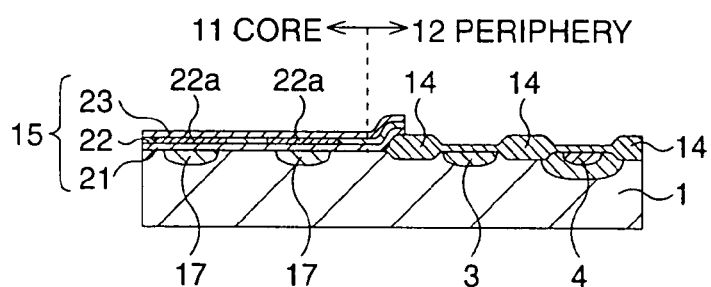
Figure 2D:
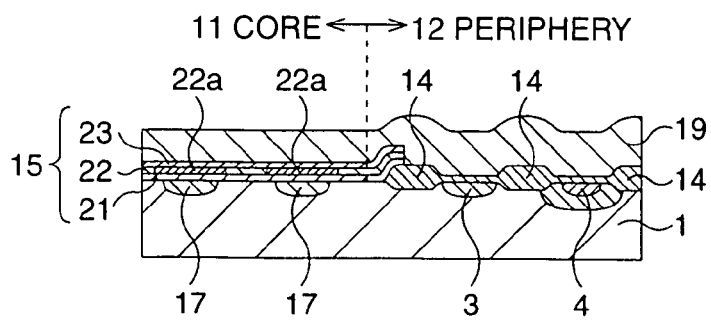
Figure 3A:
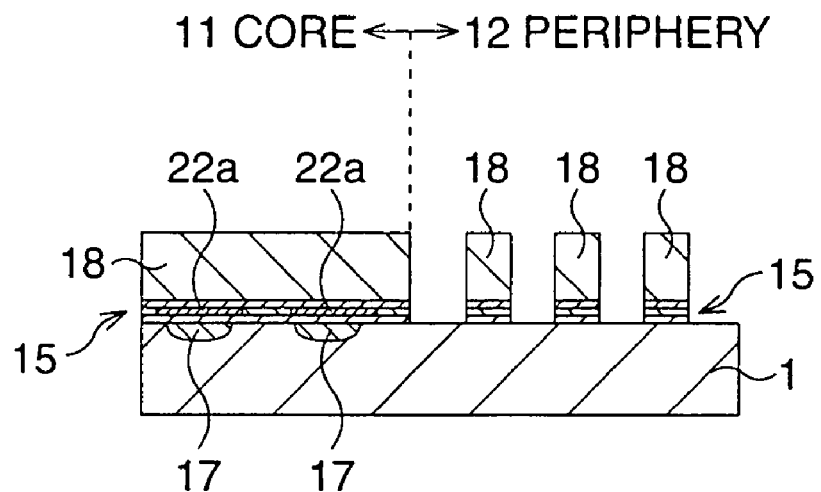
FIG. 3A and FIG. 3B are schematic sectional views showing the manufacturing method of the semiconductor memory device including the embedded bit line type SONOS transistor according to the first embodiment followed by FIG. 2D in order of process.
Figure 3B:
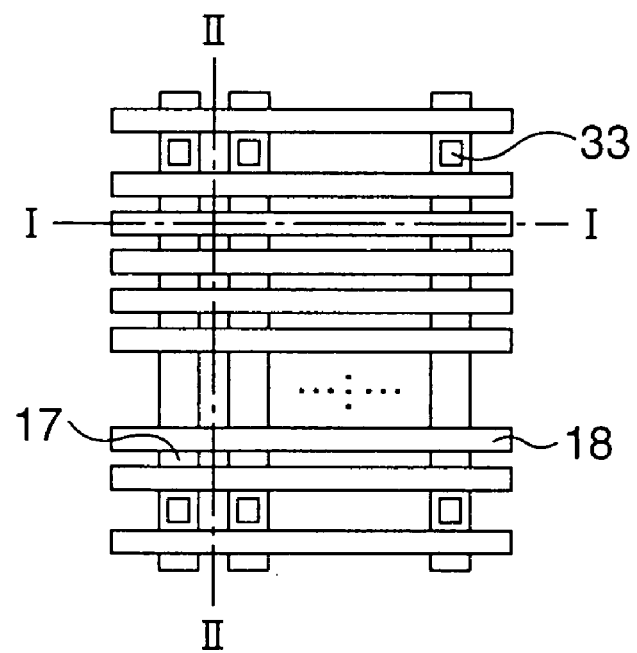

FIG. 1A to FIG. 1D and FIG. 2A to FIG. 2D are schematic sectional views showing a manufacturing method of the semiconductor memory device including an embedded bit line type SONOS transistor according to the present invention in order of process, and FIG. 3B is a schematic plan view corresponding to FIG. 3A. In FIG. 3A and FIG. 3B, the memory cell array region (core region) alone is shown, a cross section taken along the line I-I of FIG. 3B corresponds to a core X of FIG. 3A, and a cross section taken along the line II-II corresponds to a core Y of FIG. 3A respectively.

First, as shown in FIG. 1A, wells 3, 4 are formed in a peripheral circuit region 12. Specifically, a silicon oxide film 2 having a film thickness of approximately 20 nm is formed on a surface of a p-type silicon semiconductor substrate 1. By patterning the silicon oxide film 2 by means of a photolithography and a subsequent dry etching, a mask is formed, of which shape has openings at predetermined portions of the peripheral circuit region 12. After ion implanting an n-type impurity, phosphor (P) in this case, into the openings using this mask, the impurity is thermally diffused by an annealing treatment to form each well 3 in the peripheral circuit region 12. It is also preferable to ion-implant a p-type impurity, for example boron (B), further in the well 3 to form a triple well 4.

Subsequently, as shown in FIG. 1B, element isolation structures are formed in the peripheral circuit region 12. In this process, field oxide films 14 are formed in the peripheral circuit region 12 by a so-called LOCOS method to demarcate element active regions. It is also preferable to perform, for example, an STI (Shallow Trench Isolation) method that forms trenches in element isolation regions of the semiconductor substrate and fills the trenches with insulators to form the element isolation structures, instead of the LOCOS method.

Specifically, a SiN film (not shown) is formed to have a film thickness of approximately 100 nm on the silicon oxide film 2 and processed by patterning to be a shape which has openings only at the element isolation regions of the peripheral region 12. Portions exposed from the openings of the silicon oxide film 2 are oxidized and the thick field oxide films 14 are formed only at the element isolation regions to demarcate the element active regions.

Subsequently, as shown in FIG. 1C, after removing the silicon oxide film 2, a lower silicon oxide film 21 to be a tunnel insulating film, a silicon nitride film 22 to be a charge trap film, and an upper silicon oxide film 23 respectively having film thicknesses of approximately 7 nm, 10 nm, and 10 nm are sequentially formed as an ONO film 15.

The silicon nitride film 22 is formed by a plasma nitriding method with a microwave excited.

Figure 4:
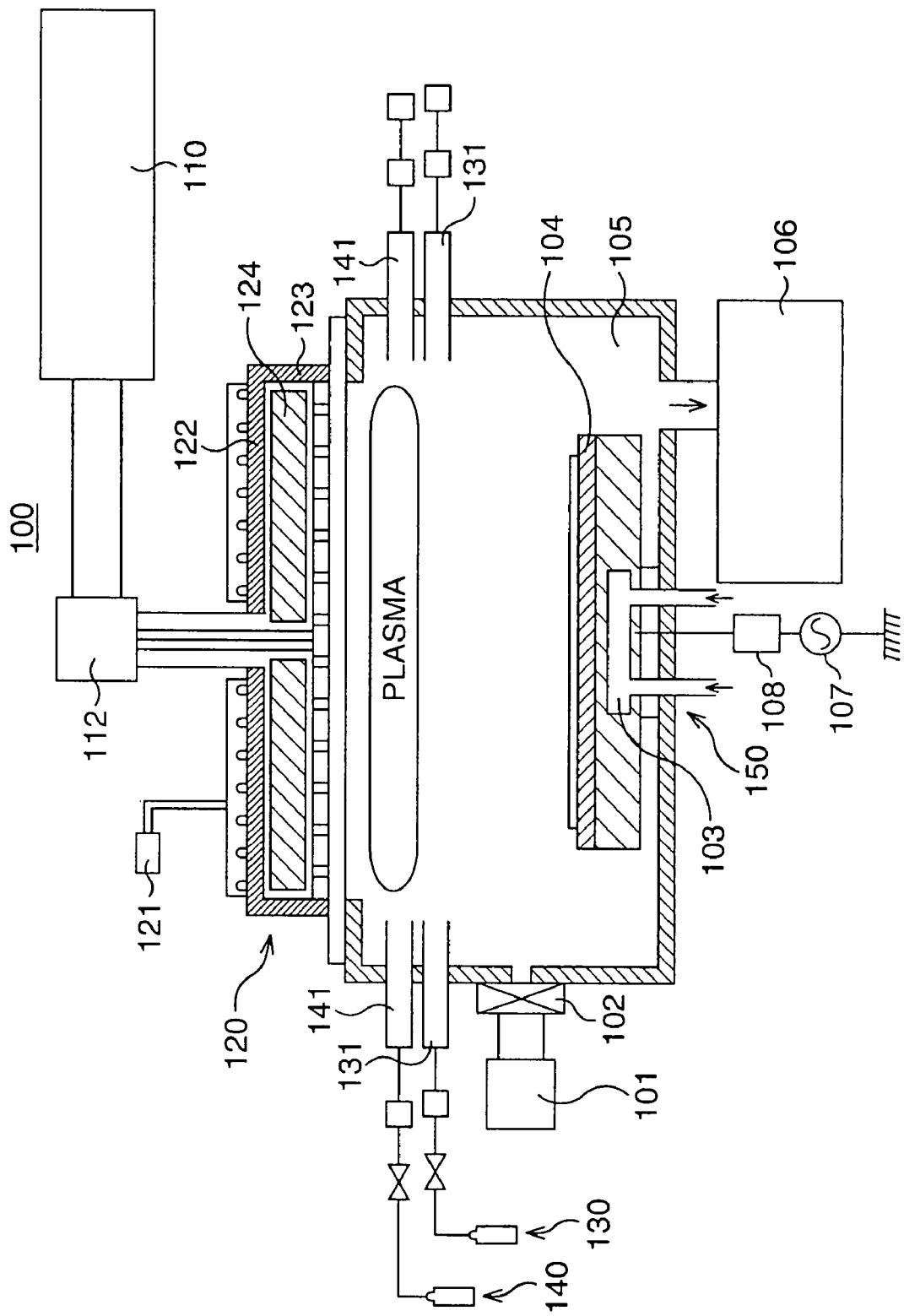
FIG. 4 is a schematic view showing a schematic configuration of a plasma processor including a radial line slot antenna used for some embodiments.

Specifically, a plasma nitriding is performed by means of a plasma processor including a radial line slot antenna as shown in FIG. 4. The plasma processor 100 is composed of a gate valve 102 continuously connected to a cluster tool 101, a processing chamber 105 which can house a susceptor 104 on which a processing object W (semiconductor substrate 1 in the present embodiment) is mounted and has a cooling jacket 103 cooling the processing object W when the plasma processing, a high-vacuum pump 106 connected to the processing chamber 105, a microwave supply source 110, an antenna member 120, a radio-frequency power supply for bias 107 and a matching box 108 composing an ion plating with the antenna member 120, gas supply systems 130, 140 including gas supply rings 131, 141 and a temperature control unit 150 performing the temperature control of the processing object W.

The microwave supply source 110 is made of, for example, magnetron, and can usually generate 2.45 GHz microwave (for example, 5 kW). After that, the transmission mode of the microwave is converted to a TM mode, a TE mode, TEM mode or the like by a mode converter 112.

The antenna member 120 includes a temperature-adjusting plate 122, a housing member 123 and a dielectric plate. The temperature-adjusting plate 122 is connected to a temperature controller 121, and the housing member 123 houses a wavelength shortening material 124 and a slot electrode (not shown) touching the wavelength shortening material 124. The slot electrode is called as a radial line slot antenna (RLSA) or an ultrahigh efficiency flat antenna. In the present embodiment, other types of antennas, for example, a single layer waveguide flat antenna, a dielectric substrate parallel plane slot antenna and the like are applicable.

By means of the above structured plasma processor, the nitriding processing is performed at a temperature condition of 450° C. using Ar, $N_2$, and $H_2$ as a source gas, and approximately 20 nm of the surface layer of the oxide film is substituted by the nitride film of which film thickness is 27 nm, and the silicon nitride film 22 is formed on the lower silicon oxide film 21.

In the same way, the lower silicon oxide film 21 and the upper silicon oxide film 23 are formed by the plasma oxidizing. In this case, the oxidizing is performed by using Ar and $O_2$ as the source gas and generating an oxygen radical (O*), and approximately 10 nm of the surface layer of the oxide film is substituted by the oxide film of which film thickness is approximately 20 nm at the temperature condition of 450° C. Note that the lower silicon oxide film 21 and the upper silicon oxide film 23 can be formed by a thermal oxidation method or a CVD oxidation method instead of the plasma oxidizing.

Next, as shown in FIG. 1D, a photoresist is coated on the whole surface and a resist pattern 16 is formed by the photolithography, of which shape has openings only at portions where bit lines are formed in a memory cell array region 11.

Then, after bit line diffusion layers 17 are formed in the memory cell array region 11 by ion implanting with the resist pattern 16 taken as a mask, lattice defects are given to the silicon nitride film 22 by a further ion implantation.

Specifically, first, as shown in FIG. 2A, an n-type impurity, arsenic (As) in this case, is ion implanted with the resist pattern 16 taken as the mask in a condition that an acceleration energy is 70 keV, and a dose amount is $2.0 \times 10^{15}/cm^2$ to form the bit line diffusion layers 17 to be sources/drains on the surface layer of the semiconductor substrate 1, corresponding to positions of the ONO film 15 exposed from the openings 16a of the resist pattern 16.

Next, as shown in FIG. 2B, the arsenic is ion implanted in a condition that the acceleration energy is 10 keV to 20 keV, and the dose amount is from $1.0 \times 10^{12}/cm^2$ to $2.0 \times 10^{15}/cm^2$, from a direction inclined at a predetermined angle, a tilt angle of 45° in this case, with respect to direction vertical to the surface of the semiconductor substrate 1, with the resist pattern 16 taken as the mask again, and lattice defects 22a are selectively given to the portions corresponding to the openings 16a of the resist pattern 16 of the silicon nitride film 22, namely, the portions corresponding to upper portions of the bit line diffusion layers 17 to form the charge trap centers. Owing to the ion implantation with the tilt angle given, a memory cell structure such that hot electrons are chiefly injected into the place approximately 30 nm~50 nm inside the channel from the joint portion of the bit line diffusion layer 17 can be realized.

It is related, for example, in "Characterization of Channel Hot Electron Injection by the Subthreshould Slope of NROM™ Device" in IEEE ELECTRON DEVICE LETTERS, VOL. 22, No. 11 issued in November 2001, that an actual device characteristic corresponds to a simulation result when the hot electrons are injected into the place 40 nm inside the channel from the joint portion of the bit line diffusion layer.

In the ion implantation of the impurity which gives damage to the silicon nitride film 22, it is preferable to select an acceleration energy to damage as little as possible the lower silicon oxide film 21 as being a base tunnel insulating film. In the present embodiment, a density peak of arsenic at the time of the ion implantation is set to be exist in the vicinity of an interface between the silicon nitride film 22 and the upper silicon oxide film 23, and the rate of the arsenic penetrating to the lower silicon oxide film 21 is set to be not more than 15% of the entire ion implantation amount.

In the present embodiment, it is explained as an example that after the ion implantation for forming the bit line diffusion layers 17 is performed, the ion implantation for giving the lattice defects 22a to the silicon nitride film 22 is performed, however, the former ion implantation can be performed after the latter ion implantation, reversing the order.

Subsequently, as shown in FIG. 2C, after the resist pattern 16 is removed by an ashing treatment or the like, the ONO film 15 on the peripheral circuit region 12 is removed by patterning. Then, a gate insulating film is formed on the peripheral circuit region 12. In this case, two kinds of gate insulating films having different film thicknesses 31, 32 are formed.

Specifically, a first thermal oxidation at 1000° C. is performed to form silicon oxide films of which film thickness is approximately 8 nm in respective element active regions of the peripheral circuit region 12. After the photolithography and a HF processing are performed, a second thermal oxidation at 1000° C. is performed to form silicon oxide film of which film thickness is approximately 10 nm. Resultingly, the gate insulating film 31 having a film thickness of approximately 10 nm is formed on one element active region (region of the well 3), and the gate insulating film having a film thickness of approximately 13 nm is formed on the other element active region (region of the well 4) respectively.

Subsequently, gate electrodes 18 are pattern-formed in the memory cell array region 11 and the peripheral circuit region 12 respectively.

Specifically, as shown in FIG. 2D, a stacked film 19 composed of a polycrystalline silicon film respectively having a film thickness of approximately 100 nm and a tungsten silicide film having a film thickness of approximately 150 nm are stacked-formed. Then, as shown in FIG. 3A and FIG. 3B, by patterning the stacked film 19 and the ONO film 15 (and the gate insulating films 31, 32) using the photolithography and a sequential dry etching, the gate electrode 18 crossing (in this case, orthogonal to) the bit line diffusion layer 17 through the ONO film 15 and functioning as a word line is formed in the memory cell array region 11, and a gate electrode (not shown) extended through the gate insulating films 31, 32 on the semiconductor substrate 1 is formed in the peripheral circuit region 12 respectively.

Subsequently, the sources/drains are formed, specifically, a p-type source/drain in which a p-type impurity is ion implanted into the well 3, and an n-type source/drain in which an n-type impurity is ion implanted into the well 4 (both not shown) are formed in the peripheral circuit region respectively.

After that, a SONOS transistor is completed through the formation of an interlayer film, a wiring layer, a contact hole and the like(all not shown).

The SONOS transistor operates as follows.

In the vicinity of the bit line diffusion layer 17 functioning as the drain, channel hot electrons are generated when writing data and hot holes are generated when erasing data by a band-to-band tunneling. The electrons and holes generated at this time are captured in the silicon nitride film 22. In addition, when the data is read out, functions of source and drain are switched with each other, and the difference of threshold value caused by the difference of positive and negative amount of the captured charge is detected.

As described above, according to the present embodiment, a highly reliable SONOS transistor can be realized, in which the high quality silicon nitride film 22 is formed by the plasma nitriding method in a low temperature condition, in addition, the silicon nitride film 22 can be used as a charge trap film having a charge capture function sufficiently adaptable for a miniaturization and a high integration which are recent demands.

Modification Example

Here, some modification examples of the present embodiment are explained. In these modification examples, a semiconductor memory device including a embedded bit line type SONOS transistor are illustrated in the same way as the present embodiment, however, these examples differ from the present embodiment in a part of the main process.

Modification Example 1

Figure 5:
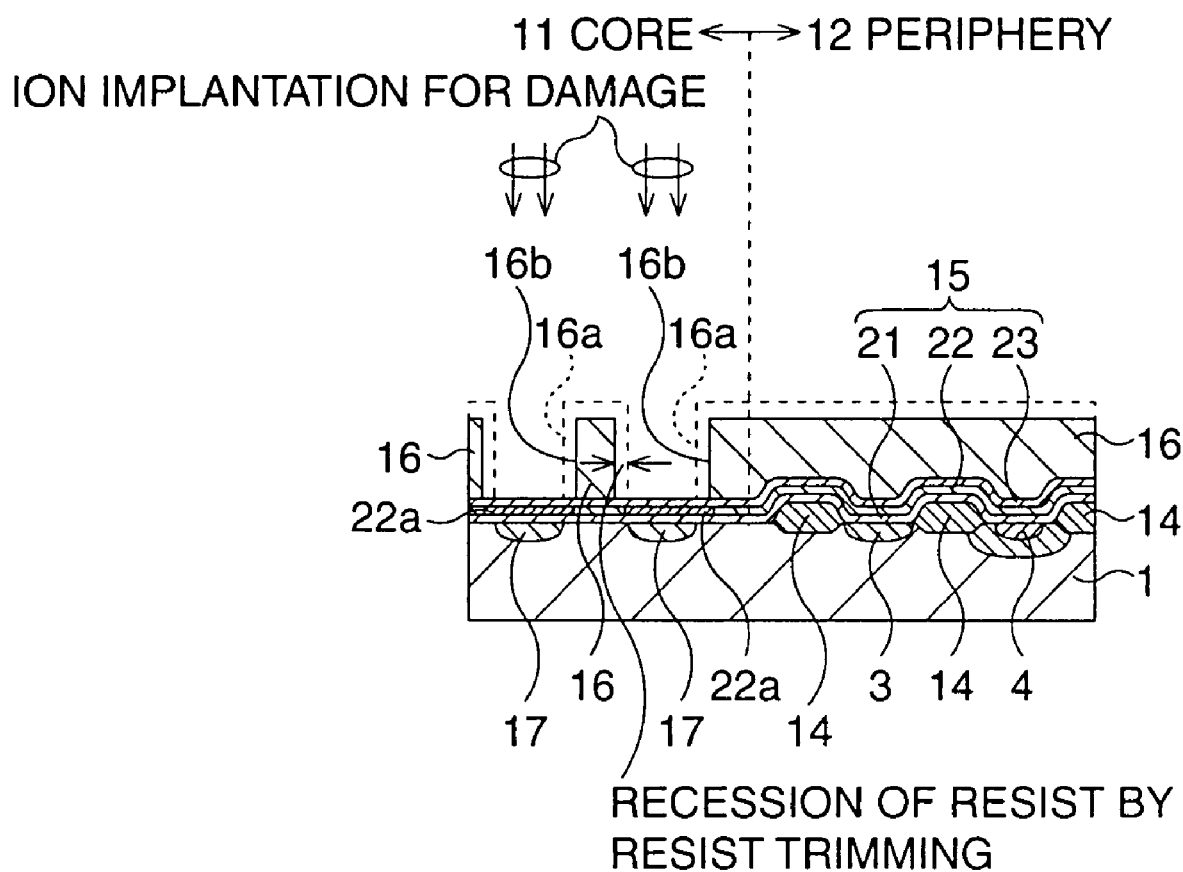
FIG. 5 is a schematic sectional view showing a main process in a manufacturing method of a semiconductor memory device of a modification example 1 in the first embodiment.

FIG. 5 is a schematic sectional view showing a main process in a manufacturing method of a semiconductor memory device of a modification example 1.

In the modification example 1, after bit line diffusion layers 17 are formed through the respective processes of FIG. 1A to FIG. 1D in the same way as the present embodiment, openings 16a of a resist pattern 16 are enlarged (receding) with a resist trimming performed to the resist pattern 16 to form openings 16b which are broader than the width of the bit line diffusion layers 17, as shown in FIG. 5.

Then, an ion implantation of an impurity (arsenic in this case) is performed from a direction vertical to the surface of the semiconductor substrate 1 with the resist pattern 16 having the enlarged openings 16b taken as a mask in the same way as forming the bit line diffusion layers 17, and lattice defects 22a are given to a silicon nitride film 22 to form charge trap centers.

In this case, since the width of the opening 16b is broader than the bit line diffusion layer 17, an excellent memory cell structure can be realized, such that hot electrons are injected into the place approximately 30 nm to 50 nm inside the channel from the joint portion of the bit line diffusion layer 17 even by the ion implantation with an ordinary angle (tilt angle 0 (zero)°).

After that, the semiconductor memory device is completed through the respective processes of FIG. 2C to FIG. 3A, FIG. 3B in the same way as the present embodiment.

According to the present modification example, a reliable semiconductor memory device can be realized, in which the high quality silicon nitride film 22 is formed by the plasma nitriding method in the low temperature condition, in addition, the silicon nitride film 22 can be utilized as a charge trap film having a charge capture function sufficiently adaptable for a miniaturization and a high integration which are recent demands.

Modification Example 2

Figure 6A:
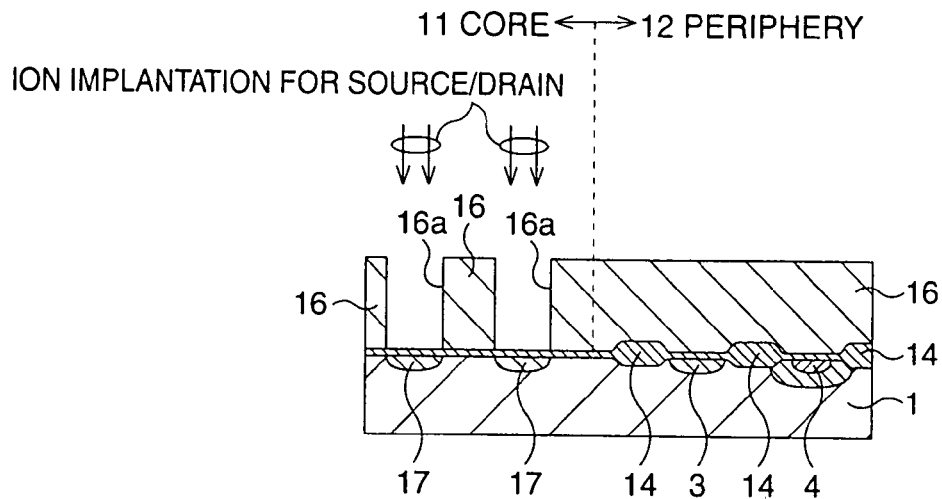
FIG. 6A to FIG. 6C are schematic sectional views showing main processes in a manufacturing method of a semiconductor memory device of a modification example 2 in the first embodiment.
Figure 6B:
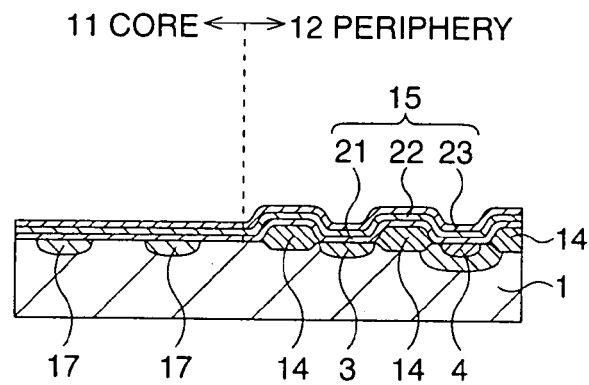
Figure 6C:
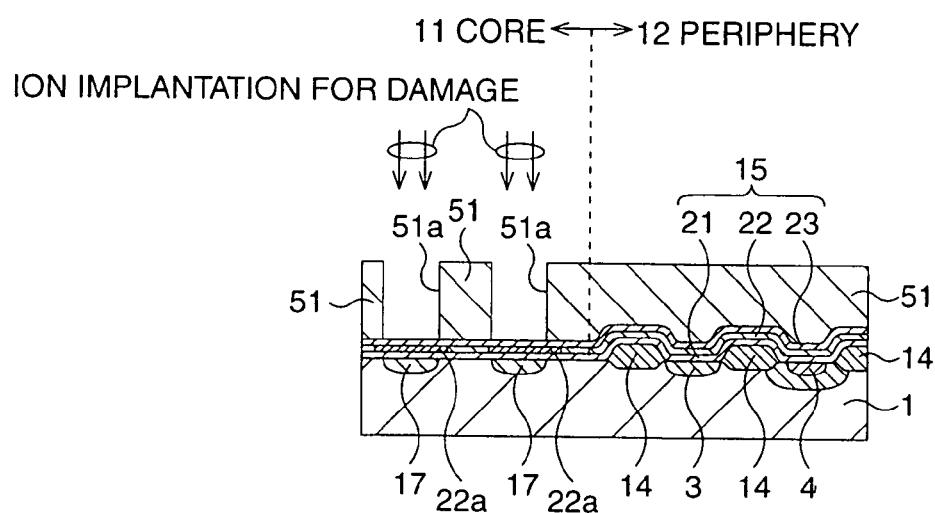

FIG. 6A to FIG. 6C are schematic sectional views showing main processes of a manufacturing method of a semiconductor memory device of the modification example 2.

In the modification example 2, after element active regions are demarcated in a peripheral circuit region 12 through the respective processes of FIG. 1A and FIG. 1B in the same way as the present embodiment, a photoresist is coated on the whole surface before forming an ONO film 15 as shown in FIG. 6A, a resist pattern 16 is formed by a photolithography, of which shape has openings only at portions where bit lines are formed in a memory cell array region 11, and bit line diffusion layers 17 are formed by an ion implantation with the resist pattern taken as a mask.

Subsequently, as shown in FIG. 6B, after the resist pattern 16 is removed by the ashing treatment or the like and a silicon oxide film 2 is removed, an upper silicon oxide film 21, a silicon nitride film 22 by the aforementioned plasma nitriding method, then a lower silicon oxide film 23 are sequentially formed to be the ONO film 15.

Subsequently, as shown in FIG. 6C, the photoresist is coated on the whole surface, and a resist pattern 51 is formed by the photolithography, of which shape has openings only at portions where bit lines are formed in the memory cell array region 11. In this case as shown in the drawing, it is preferable that the resist pattern 51 is formed to be a shape having openings 51a of which width is broader than the bit line diffusion layer 17.

Then, the ion implantation is performed with the resist pattern 51 taken as a mask, and the lattice defects 22a are given to form charge trap centers.

Specifically, arsenic is ion implanted from a direction vertical to the surface of the semiconductor substrate 1 in a condition that an accelerator energy is from 10 keV to 20 kev and a dose amount is from $1.0 \times 10^2/cm^2$ to $2.0 \times 10^{15}/cm^2$, and lattice defects 22a are selectively given to portions corresponding to the openings 51a of the resist pattern 51 of the silicon nitride film 22, namely, corresponding to upper portions of the bit line diffusion layers 17 of the silicon nitride film 22.

It is also preferable that a resist pattern having openings of which widths are almost same as the bit line diffusion layer 17 is formed, instead of forming the resist pattern 51 having broader openings 51a than the width of the bit line diffusion layer 17 as the present modification example, and that the ion implantation is performed from a direction inclined at a predetermined angle (for example, a tilt angle of 45°) with respect to the direction vertical to the surface of the semiconductor substrate 1 in the same way as the present embodiment.

After that, a semiconductor memory device is completed through the respective processes of FIG. 2C to FIG. 3A, and FIG. 3B in the same way as the present embodiment.

According to the present modification example, a reliable semiconductor memory device can be realized, in which a high quality silicon nitride film 22 is formed by the plasma nitriding method in a low temperature condition, in addition, the silicon nitride film 22 can be utilized as a charge trap film having a charge capture function sufficiently adaptable for a miniaturization and a high integration which are recent demands.

Furthermore, according to the present modification example, the ion implantation for forming the embedded bit line 17 is performed before the ONO film 15 is formed so that damage generated by the impurity penetrating through the ONO film 15 can be prevented and sufficient withstand voltage between a bit line and a word line can be secured.

Second Embodiment

In the present embodiment, as a semiconductor memory device, a transistor having a conventional MONOS structure which is not an embedded bit line type transistor, in which element isolation structures are formed in a memory cell array region will be disclosed. Note that the structure of the transistor is explained with a manufacturing method thereof for convenience.

The semiconductor memory device is one in which a MONOS transistor of a memory cell region has a channel vertical to a word line, and a CMOS transistor is formed in a peripheral circuit region.

FIG. 7A to FIG. 7D, FIG. 8A and FIG. 8B are schematic sectional views showing a manufacturing method of the semiconductor memory device including the MONOS transistor according to the present embodiment in order of process.

In the same way as FIG. 3A, a portion denoted by a core X in the left side of the memory cell array region (core region) 11 shows a cross section along a longitudinal direction of a gate electrode, and a portion denoted by a core Y in the right side shows a cross section perpendicular to the longitudinal direction of the gate electrode in respective drawings. With respect to structural members and the like corresponding to the first embodiment, the same numerals are given and the explanations thereof are omitted.

Figure 7A:
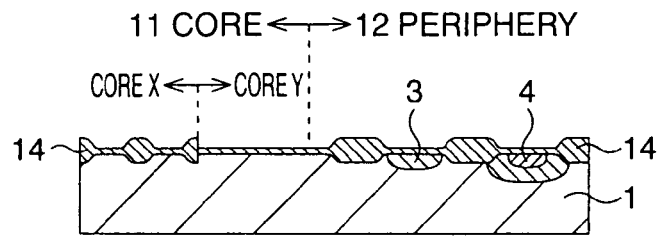
FIG. 7A to FIG. 7D are schematic sectional views showing a manufacturing method of a semiconductor memory device including a MONOS transistor according to a second embodiment in order of process.

First, as shown in FIG. 7A, wells 3, 4 are formed in a peripheral circuit region 12 in the same way as the first embodiment.

Subsequently, element active regions are demarcated respectively in the memory cell array region 11 and in the peripheral circuit region 12 by a so-called LOCOS method.

Specifically, a SiN film (not shown) is formed to have a film thickness of 10 nm on a silicon oxide film 2. The SiN film is patterned and processed to a shape having openings only at respective element isolation regions of the memory cell array region 11 and the peripheral circuit region 12. Then, portions exposed from the openings of the silicon oxide film 2 are oxidized and thick field oxide films 14 are formed only at the element isolation regions to demarcate element active regions.

Figure 7B:
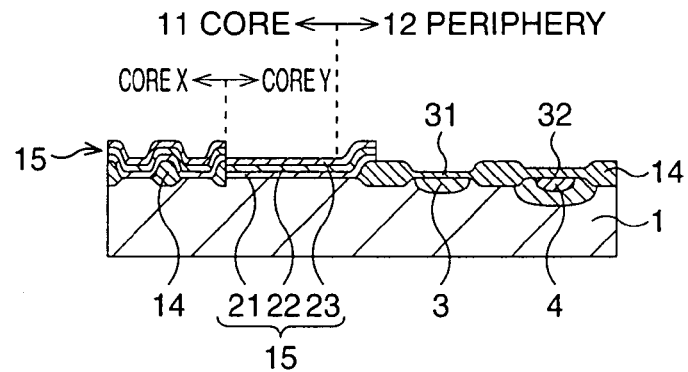

Subsequently, as shown in FIG. 7B, after the silicon oxide film 2 is removed, a lower silicon oxide film 21 to be a tunnel insulating film, a silicon nitride film 22 to be a charge trap film, and an upper silicon oxide film 23 respectively having film thicknesses of approximately 7 μm, 10 μm and 10 μm are sequentially formed as an ONO film 15. The silicon nitride film 22 is formed by the aforementioned plasma nitriding method in the same way as the first embodiment, and the lower silicon oxide film 21 and the upper silicon oxide film 23 are formed by a plasma oxidizing or a thermal oxidation method or a CVD oxidation method.

Subsequently, after the ONO film 15 of the peripheral circuit region 12 is removed by patterning the ONO film 15, two kinds of gate insulating films 31, 32 having different film thicknesses are formed in the peripheral circuit region 12 by two times thermal oxidation.

Figure 7C:
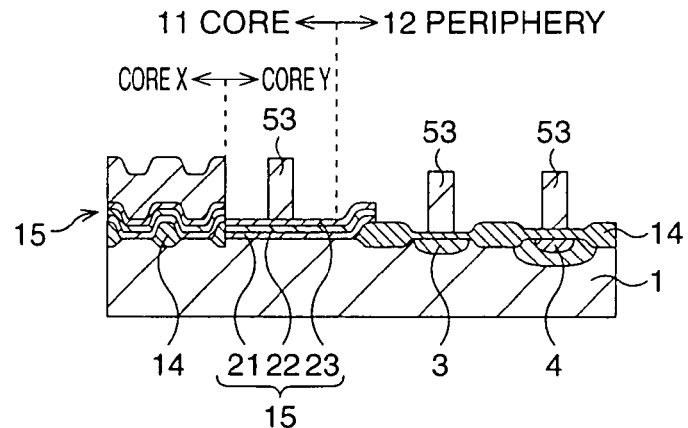

Subsequently, as shown in FIG. 7C, after a stacked film composed of a polycrystalline silicon film and a tungsten silicide film is formed, gate electrodes 53 are pattern-formed on the ONO film in the memory cell array region 11 and on the gate insulating films 31, 32 in the peripheral circuit region 12 by patterning the stacked film (and the gate insulating films 31, 32) in the same way as the first embodiment.

Figure 7D:
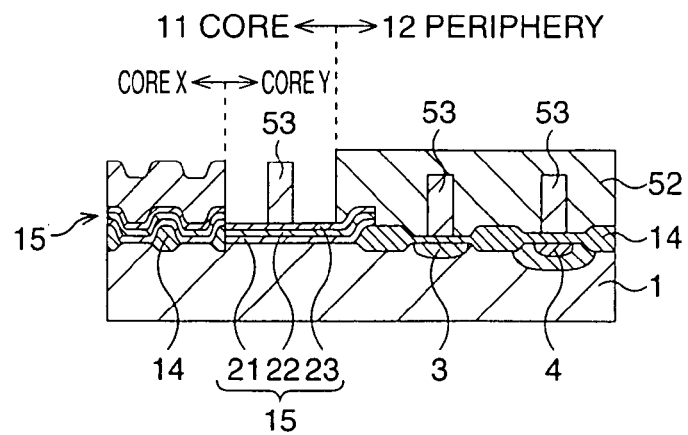

Subsequently, as shown in FIG. 7D, a photoresist is coated on the whole surface, and a resist pattern 52 is formed by a photolithography, of which shape covers the peripheral circuit region 12 and has openings in the memory cell array region 11.

Then, after sources/drains 54 are formed in the memory cell region 11 by an ion implantation with the resist pattern 52 and the gate electrodes 53 taken as masks, lattice defects are given to the silicon nitride film 22 by a further ion implantation.

Figure 8A:
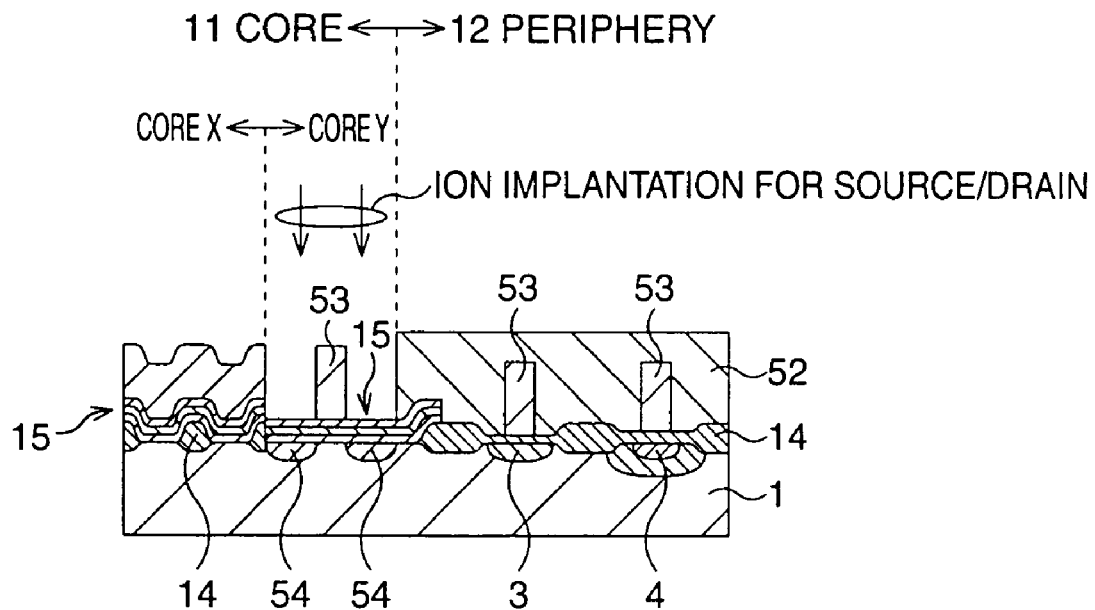
FIG. 8A and FIG. 8B are schematic sectional views showing the manufacturing method of the semiconductor memory device including the NOMOS transistor according to the second embodiment followed by FIG. 7D in order of process.

Specifically, as shown in FIG. 8A, first, an n-type impurity, arsenic in this case, is ion implanted in a condition that an acceleration energy is 40 keV, a dose amount is $2.0 \times 10^{15}/cm^2$, with the resist pattern 52 and the gate electrodes 53 taken as masks, and the sources/drains 54 are formed at both sides of the gate electrodes 53 of the semiconductor substrate 1 corresponding to positions of the ONO film 15 exposed from openings 52a of the resist pattern 52.

Figure 8B:
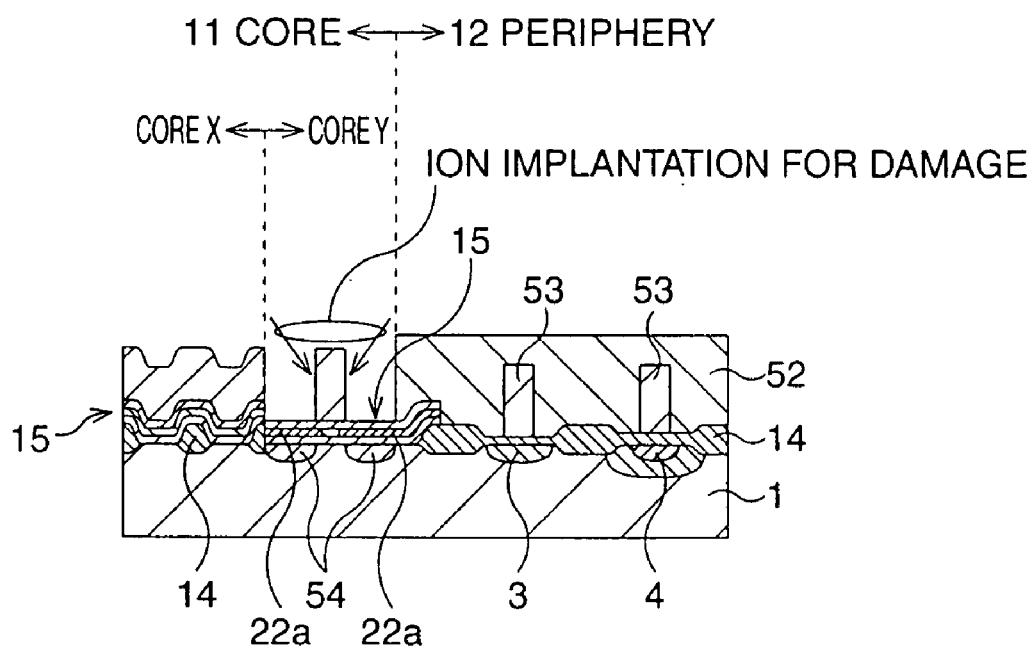

Next, as shown in FIG. 8B, the ion implantation of the arsenic is performed in the condition that the acceleration energy is 10 keV to 20 keV, and the dose amount is $1.0 \times 10^{12}/cm^2$ to $2.0 \times 10^{15}/cm^2$ from a direction inclined at a predetermined angle, a tilt angle of 45° in this case, with respect to the direction vertical to the surface of the semiconductor substrate 1, with the resist pattern 52 taken as the mask again, and lattice defects 22a are selectively given to portions corresponding to openings 52a of the resist pattern 52 of the silicon nitride film 22, namely, upper portions of the sources/drains 54 of the silicon nitride film 22 to form charge trap centers.

In the present embodiment, it is explained as an example that after the ion implantation for forming the source/drain 54 is performed, the ion implantation for giving the lattice defects 22a to the silicon nitride film 22 is performed, however, the former ion implantation can be performed after the latter ion implantation, reversing the order.

Subsequently, after the resist pattern 52 is removed by an ashing treatment or the like, an n-type source/drain is formed at one element active region of the peripheral circuit region 12, and a p-type source/drain (both not shown) is formed at the other element active region in the same way as the first embodiment.

After that, an interlayer insulating film, various kinds of contact holes, a wiring layer and the like are formed in the same way as the first embodiment to complete a MONOS transistor.

As described above, according to the present embodiment, a highly reliable MONOS transistor can be realized, in which a high quality silicon nitride film 22 is formed by the plasma nitriding method in a low temperature condition, in addition, the silicon nitride film 22 can be utilized as a charge trap film having a charge capture function sufficiently adaptable for a miniaturization and a high integration which are recent demands.

Third embodiment

In the present embodiment, an embedded bit line type transistor having a SNOS structure as a semiconductor memory device will be disclosed. Note that the structure of the transistor is explained with a manufacturing method thereof for convenience. With respect to structural members and the like corresponding to the first embodiment, the same numerals are given and the explanations thereof are omitted.

A semiconductor memory device has such a structure that a SNOS transistor in a memory cell array region is a planar type and a CMOS transistor is formed in a peripheral circuit region thereof.

FIG. 9A to FIG. 9D are schematic sectional views showing the main processes of the semiconductor memory device including the embedded bit line type SNOS transistor according to the present embodiment. In the present embodiment, an ON film 63 in which a silicon nitride film 61 and a silicon oxide film 62 are stacked is formed instead of forming the ONO film 15 in the first embodiment.

Figure 9A:
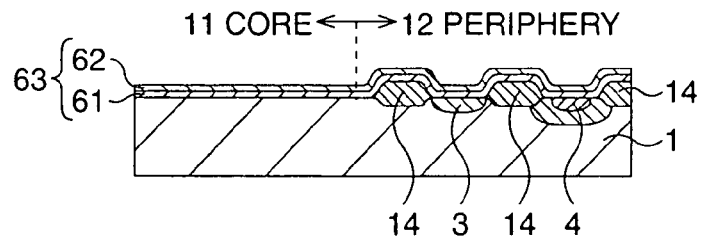
FIG. 9A to FIG. 9D are schematic sectional views showing main processes of an embedded bit line type SNS transistor according to a third embodiment.

First, after respective processes of FIG. 1A and FIG. 1B are performed in the same way as the first embodiment and the silicon oxide film 2 remained in the memory cell array region 11 is removed as shown in FIG. 9A, a lower silicon oxide film 61 to be a tunnel insulating film and a silicon nitride film 62 to be a charge trap film respectively having film thicknesses of approximately 7 μm, 10 μm are sequentially formed as the ON film 63. The silicon nitride film 62 is formed by the aforementioned plasma nitriding method in the same way as the first embodiment, and the lower silicon oxide film 61 is formed by a plasma oxidizing, or a thermal oxidation method and a CVD oxidation method.

Figure 9B:
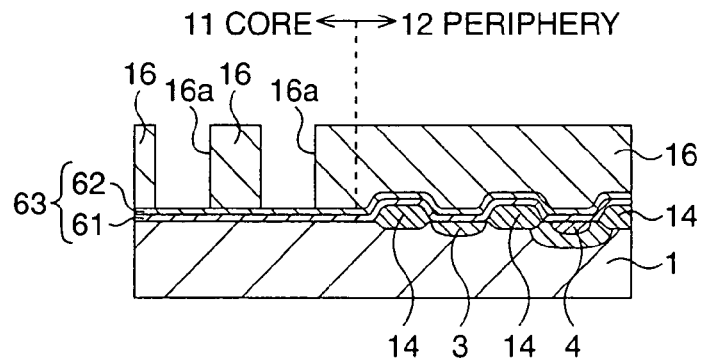

Subsequently, as shown in FIG. 9B, a photoresist is coated on the whole surface and a resist pattern 16 is formed by a photolithography, of which shape has openings only at portions where bit lines in the memory cell array 11 are formed.

Then, after bit line diffusion layers 17 are formed in the memory cell array region by performing an ion implantation with the resist pattern 16 taken as a mask, lattice defects are given to the silicon nitride film 62 by a further ion implantation.

Figure 9C:
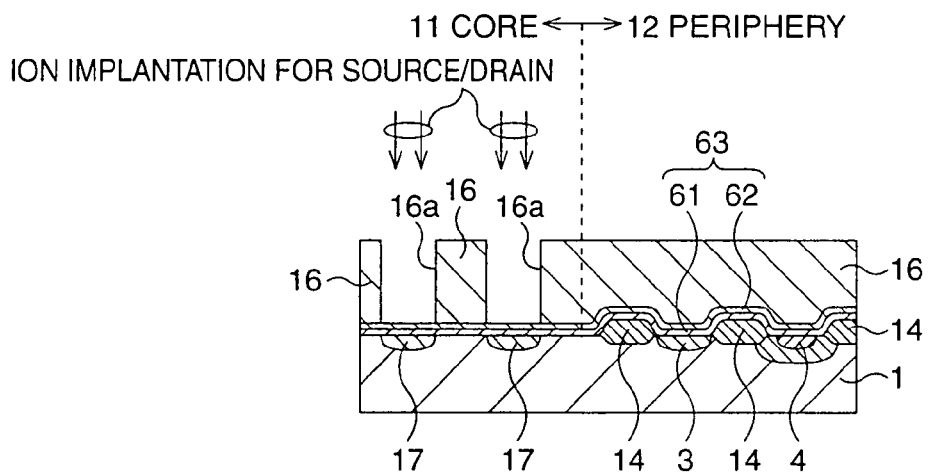

Specifically, as shown in FIG. 9C, first, an n-type impurity, arsenic (As) in this case, is ion implanted in a condition that an acceleration energy is 70 keV, and a dose amount is $2.0 \times 10^{15}/cm^2$ with the resist pattern 16 taken as the mask to form the bit line diffusion layers 17 to be sources/drains on a surface layer of the semiconductor substrate 1 corresponding to positions of the ON film 63 exposed from the openings 16a of the resist pattern 16.

Figure 9D:
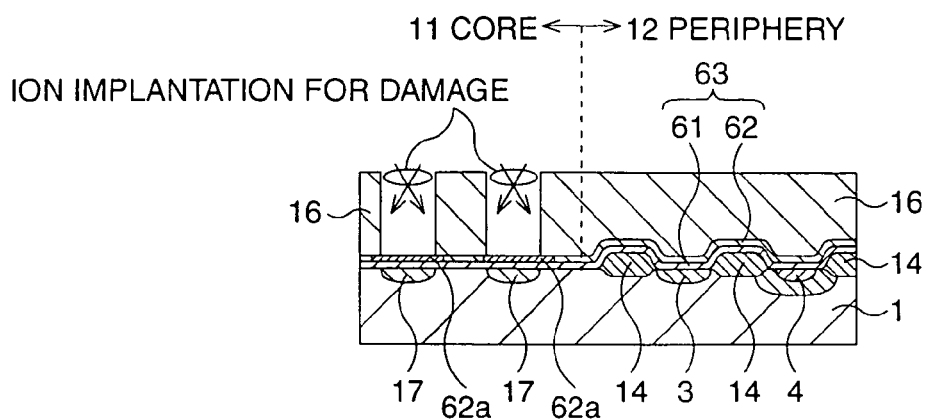

Next, as shown in FIG. 9D, the ion implantation of the arsenic is performed in a condition that the acceleration energy is 10 keV to 20 keV, and the dose amount is $1.0 \times 10^{12}/cm^2$ to $2.0 \times 10^{15}/cm^2$ from a direction inclined at a predetermined angle, a tilt angle of 45° in this case, with respect to the direction vertical to the surface of the semiconductor substrate 1, with the resist pattern 16 taken as the mask again, and lattice defects 62a are selectively given to positions corresponding to the openings 16a of the resist pattern 16 of the silicon nitride film 62, namely, the positions corresponding to upper portions of the bit line diffusion layers 17 of the silicon nitride film 62 to form charge trap centers.

In the presents embodiment, it is explained as an example that after the ion implantation for forming the bit line diffusion layers 17 is performed, the ion implantation for giving the lattice defects 62a to the silicon nitride film 62 is performed, however, the former ion implantation can be performed after the latter ion implantation, reversing the order.

After that, a SNOS transistor is completed through respective processes corresponding to the FIG. 2C to FIG. 3A, and FIG. 3B in the same way as the first embodiment.

As described above, according to the present embodiment, a highly reliable SNOS transistor can be realized, in which a high quality silicon nitride film 62 is formed by the plasma nitriding method in a low temperature condition, in addition, the silicon nitride film 62 can be utilized as a charge trap film having a charge capture function sufficiently adaptable for a miniaturization and a high integration which are recent demands.

Figure 10:
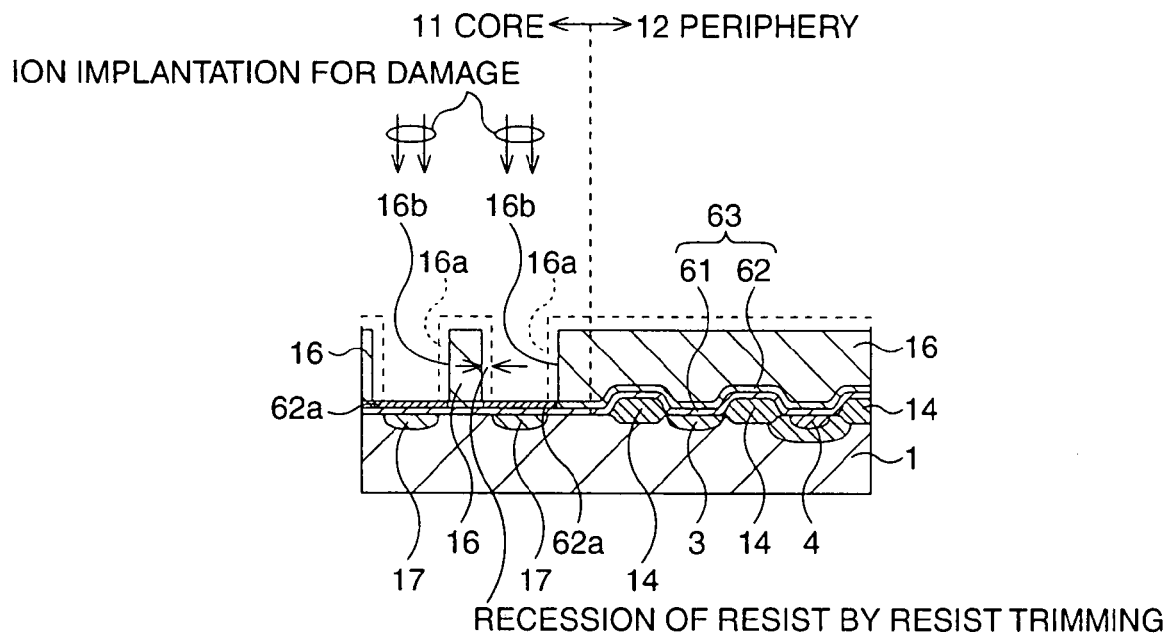
FIG. 10 is a schematic sectional view showing a main process of a semiconductor memory device including an embedded bit line type SNOS transistor according to another example of the third embodiment.

It is also preferable, in the present embodiment, in the same way as the modification example 1 of the first embodiment, as shown in FIG. 10, that the openings of the resist pattern 16 (openings 16b) are enlarged with a resist trimming performed to the resist pattern 16 after the bit line diffusion layers 17 are formed, and the lattice defects 62a are given to the silicon nitride film 62 by an ion implantation with the resist pattern 16 taken as a mask.

Figure 11A:
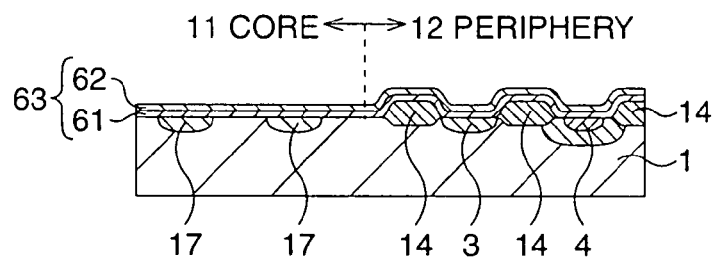
FIG. 11A and FIG. 11B are schematic sectional views showing main processes of a semiconductor memory device including an embedded bit line type SNOS transistor according to still another example of the third embodiment.
Figure 11B:
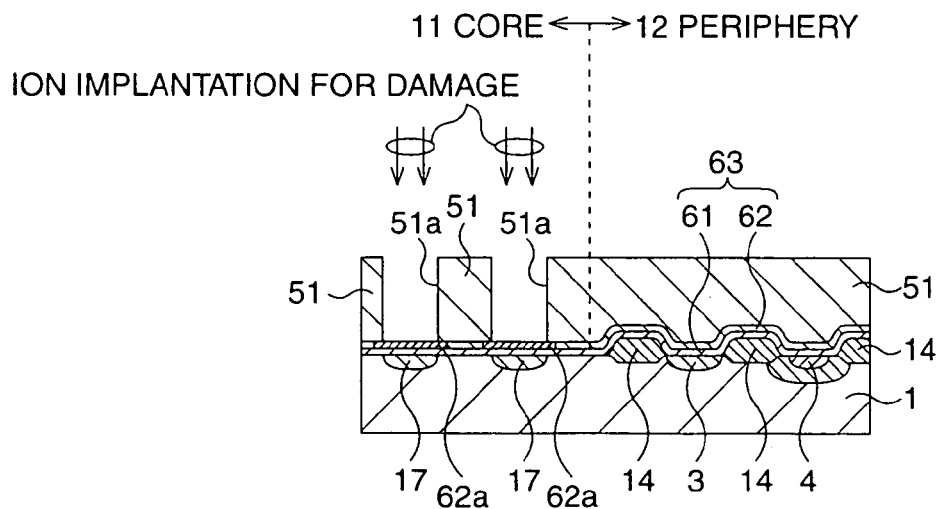

Additionally, it is preferable that, in the same way as the modification example 2 of the first embodiment, as shown in FIG. 11A, after the bit line diffusion layers 17 are formed by the ion implantation with the resist pattern 16 taken as a mask, an ON film 63 is formed, subsequently as shown in FIG. 11B, the resist pattern 16 is removed and a resist pattern 51 is formed, and lattice defects 62a are given to the silicon nitride film 62 by an ion implantation with the resist pattern 51 taken as a mask.

Figure 12A:
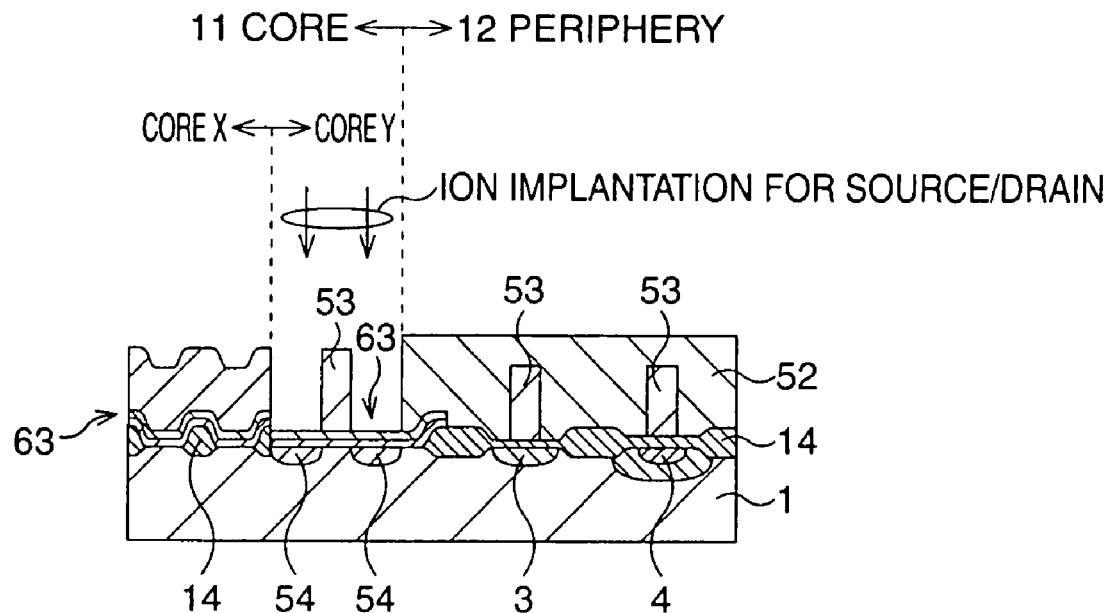
FIG. 12A and FIG. 12B are schematic sectional views showing main processes of a semiconductor memory device including an MNOS transistor according to still another example of the third embodiment.
Figure 12B:
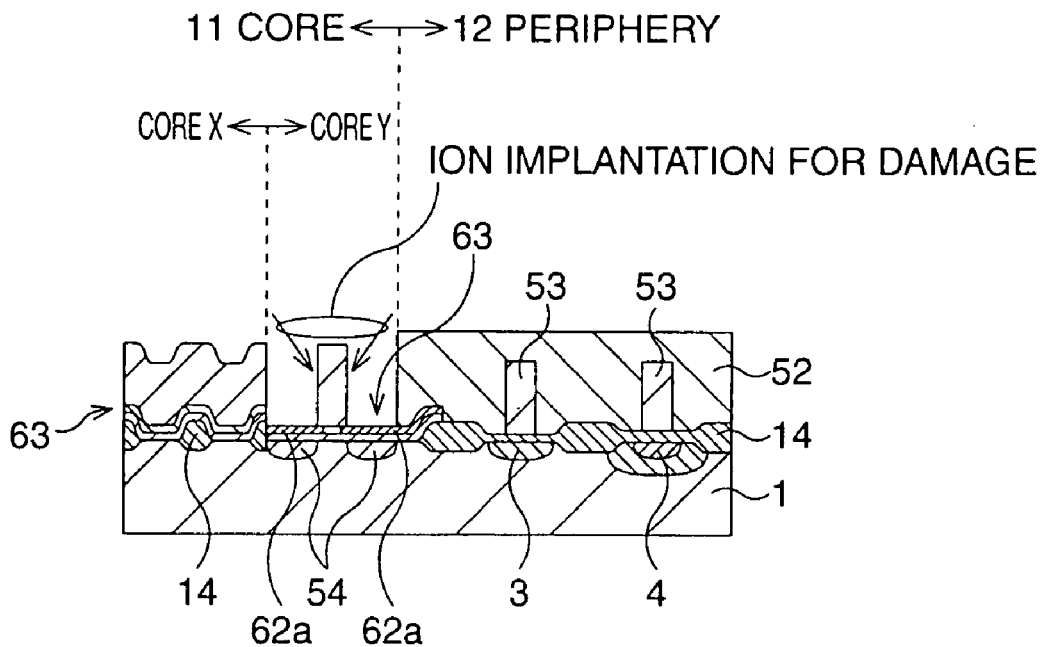

Furthermore, in the same way as the second embodiment, the present invention can be applied to a conventional transistor having a MNOS structure, in which element isolation regions are formed in a memory cell array region and which has a channel vertical to a gate electrode, instead of an embedded bit line type transistor. In this case, as shown in FIG. 12A, after sources/drains 54 are formed in the memory cell array 11 by an ion implantation with the resist pattern 52 and the gate electrodes 53 taken as masks, lattice defects 62a are given to the silicon nitride film 62 of the ON film 63 by a further ion implantation as shown in FIG. 12B. Then, p-type and n-type sources/drains are formed in the peripheral region 12, and an interlayer insulating film, various kinds of contact holes, a wiring layer and the like are formed to complete a semiconductor memory device.

Fourth Embodiment

In the present embodiment, an embedded bit line type transistor having an SNS structure as a semiconductor memory device will be disclosed. Note that the structure of the transistor is explained with a manufacturing method thereof for convenience. With respect to structural members and the like corresponding to the first embodiment, the same numerals are given and the explanations thereof are omitted.

A semiconductor memory device has such a structure that an SNS transistor in a memory cell array region is a planar type and a CMOS transistor is formed in a peripheral circuit region thereof.

FIG. 13A to FIG. 13D are schematic sectional views showing the main processes of the semiconductor memory device including the embedded bit line type SNS transistor according to the present embodiment.

In the present embodiment, a silicon nitride film 71 which is a single layer is formed instead of forming the ONO film 15 in the first embodiment.

Figure 13A:
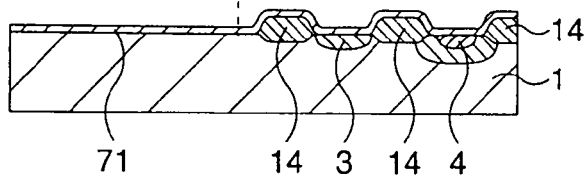
FIG. 13A to FIG. 13D are schematic sectional views showing main processes of a semiconductor memory device including an embedded bit line type SNOS transistor according to a fourth embodiment.

First, after the respective processes of FIG. 1A and FIG. 1B in the same way as the first embodiment, the silicon oxide film 2 remained in the memory cell array region 11 is removed as shown in FIG. 13A, then, a silicon nitride film 71 having a film thickness of approximately 20 nm is formed by the aforementioned plasma nitriding method in the same way as the first embodiment.

Figure 13B:
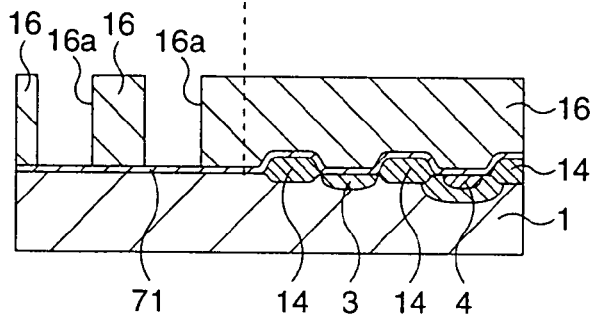

Subsequently, as shown in FIG. 13B, a photoresist is coated on the whole surface and a resist pattern 16 is formed by a photolithography, of which shape has openings only at portions where bit lines in the memory cell array region 11 are formed.

Then, after bit line diffusion layers 17 are formed in the memory cell array region 11 by an ion implantation with the resist pattern 16 taken as a mask, lattice defects are given to the silicon nitride film 62 by a further ion implantation.

Figure 13C:
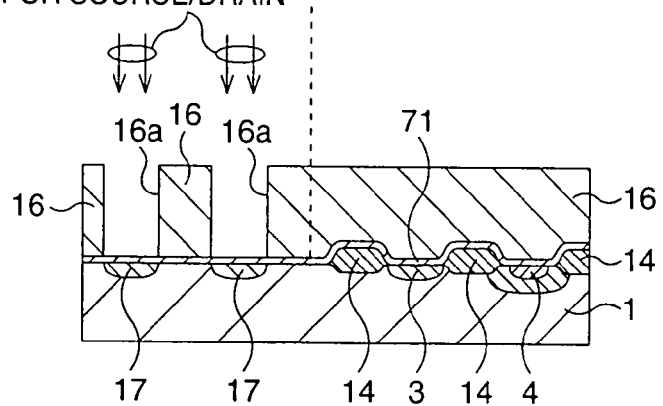

Specifically, as shown in FIG. 13C, first, an n-type impurity, arsenic (As) in this case, is ion implanted in a condition that an acceleration energy is 70 keV, and a dose amount is $2.0 \times 10^{15}/cm^2$ with the resist pattern 16 taken as the mask to form the bit line diffusion layers 17 to be sources/drains on a surface layer of the semiconductor substrate 1 corresponding to positions of the silicon nitride film 71 exposed from openings 16a of the resist pattern 16.

Figure 13D:
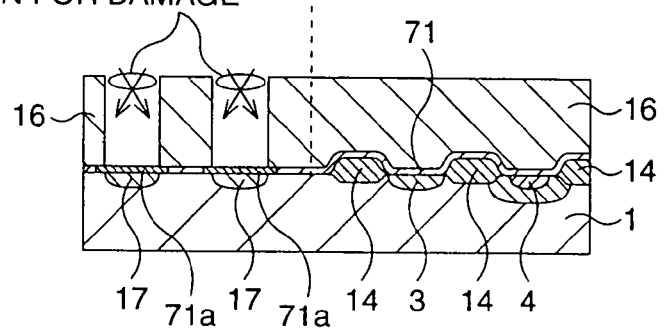

Next, as shown in FIG. 13D, the ion implantation of the arsenic is performed in a condition that the acceleration energy is 10 keV to 20 keV, and the dose amount is $1.0 \times 10^{12}/\text{cm}^2$ to $2.0 \times 10^{15}/\text{cm}^2$ from a direction inclined at a predetermined angle, a tilt angle of 45° in this case, with respect to the direction vertical to the surface of the semiconductor substrate 1, with the resist pattern 16 taken as the mask again, and lattice defects 71a are selectively given to positions corresponding to the openings 16a of the resist pattern 16 of the silicon nitride film 71, namely, the positions corresponding to upper portions of the bit line diffusion layers 17 of the silicon nitride film 71 to form charge trap centers.

In the presents embodiment, it is explained as an example that after the ion implantation for forming the bit line diffusion layers 17 is performed, the ion implantation for giving the lattice defects 71a to the silicon nitride film 71 is performed, however, the former ion implantation can be performed after the latter ion implantation, reversing the order.

After that, an SNS transistor is completed through respective processes corresponding to the FIG. 2C to FIG. 3A, and FIG. 3B in the same way as the first embodiment.

As described above, according to the present embodiment, a highly reliable SNS transistor can be realized, in which a high quality silicon nitride film 71 is formed by the plasma nitriding method in a low temperature condition, in addition, the silicon nitride film 71 can be utilized as a charge trap film having a charge capture function sufficiently adaptable for a miniaturization and a high integration which are recent demands.

Figure 14:
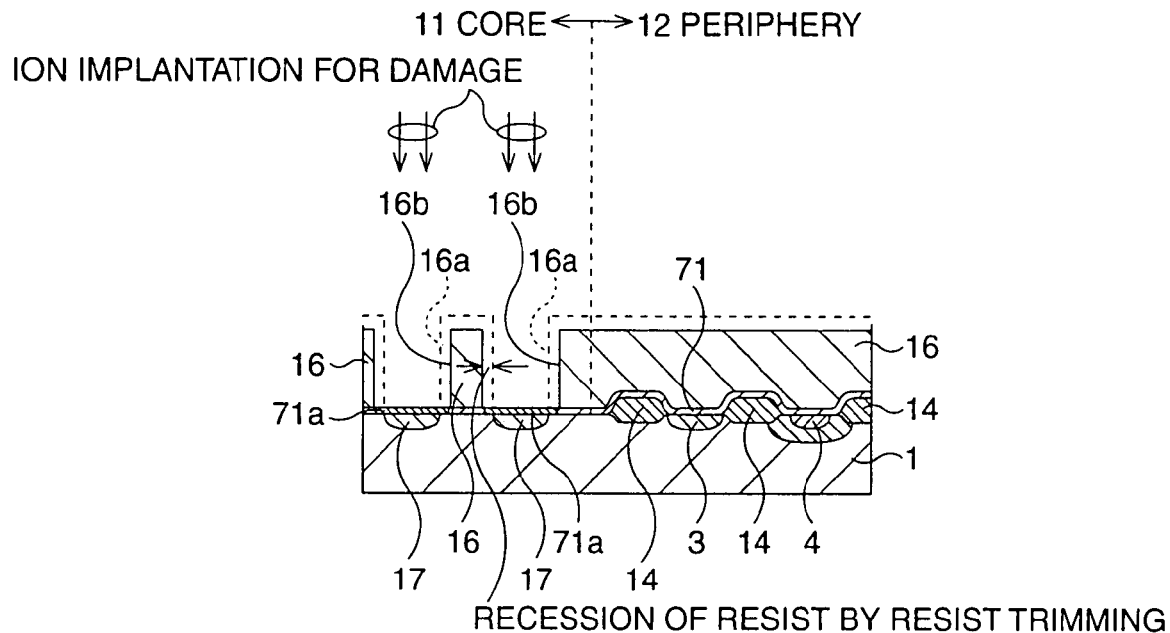
FIG. 14 is a schematic sectional view showing a main process of a semiconductor memory device including an embedded bit line type SNS transistor according to another example of the fourth embodiment.

It is also preferable, in the present embodiment, in the same way as the modification example 1 of the first embodiment, as shown in FIG. 14, that the openings of the resist pattern 16 (openings 16b) are enlarged with a resist trimming performed to the resist pattern 16 after the bit line diffusion layers 17 are formed, and the lattice defects 71a are given to the silicon nitride film 71 by an ion implantation with the resist pattern 16 taken as a mask.

Figure 15A:
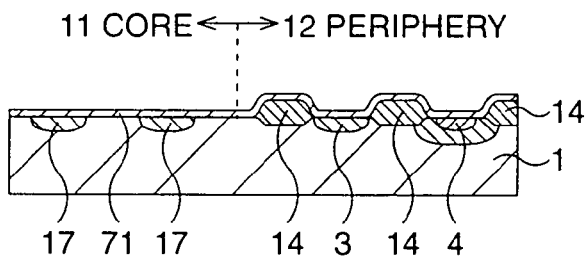
FIG. 15A and FIG. 15B are schematic sectional view showing main processes of a semiconductor memory device including an embedded bit line type SNS transistor according to still another example of the fourth embodiment.
Figure 15B:
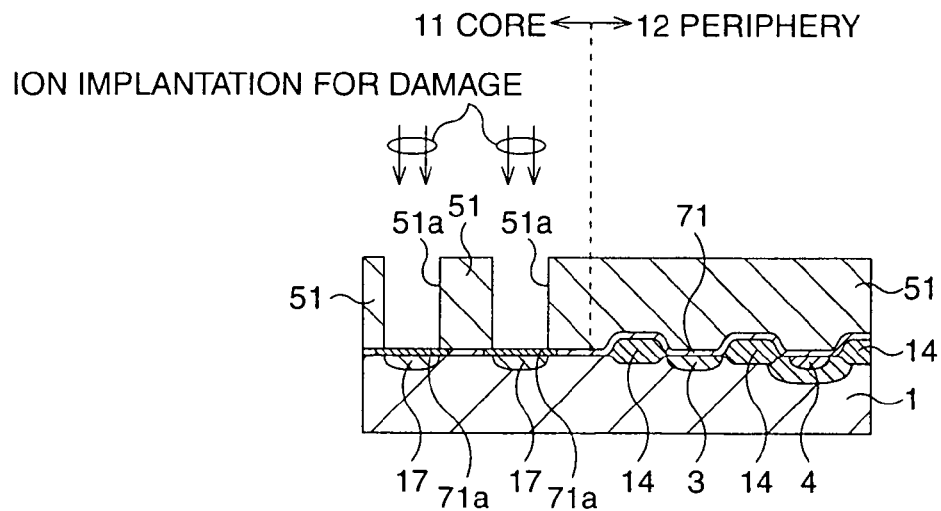

In addition, in the same way as the modification example 2 of the first embodiment, it is preferable that after the bit line diffusion layers 17 are formed by an ion implantation with the resist pattern 16 taken as a mask before forming the silicon nitride film 71 as shown in FIG. 15A, the resist pattern 16 is removed and a resist pattern 51 is formed, and the lattice defects 71a are given to the silicon nitride film 71 by an ion implantation with the resist pattern 51 taken as a mask as shown in FIG. 15B.

Figure 16A:
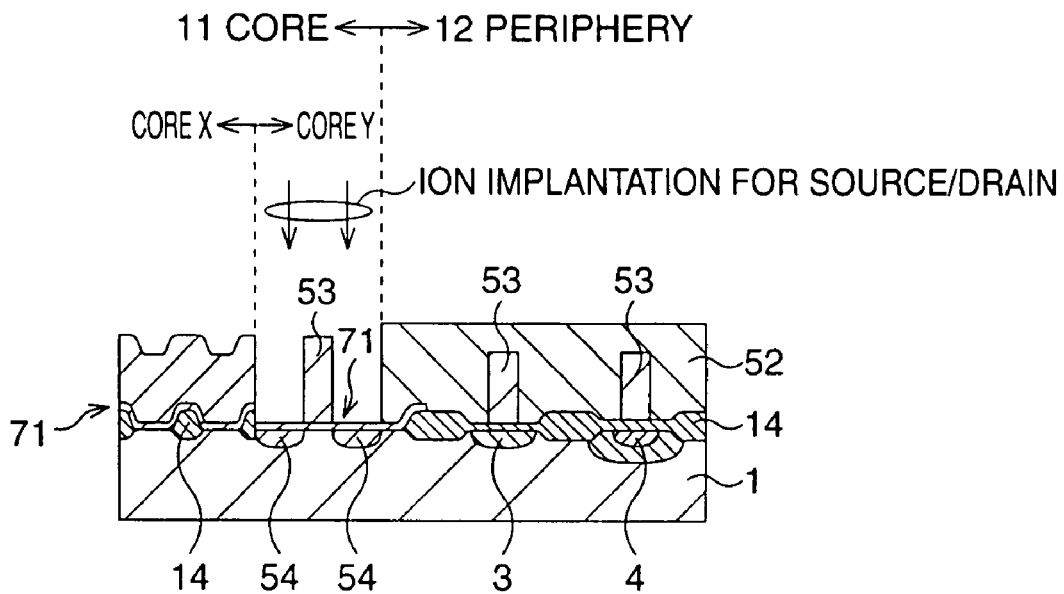
FIG. 16A and FIG. 16B are schematic sectional view showing main processes of a semiconductor memory device including an MNS transistor according to still another example of the fourth embodiment.
Figure 16B:
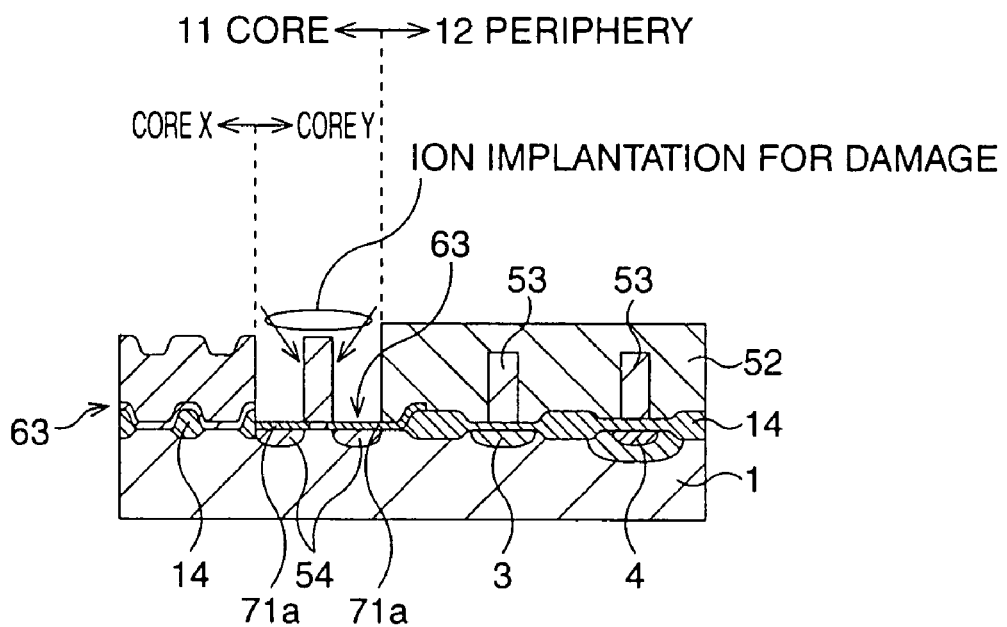

Furthermore, in the same way as the second embodiment, the present invention can be applied to a conventional transistor having an MNS structure, in which element isolation regions are formed in the memory cell array region, instead of the embedded bit line type transistor. In this case, after sources/drains 54 are formed in the memory cell array region by an ion implantation with a resist pattern 52 and gate electrodes 53 taken as masks as shown in FIG. 16A, the lattice defects 71a are given to the silicon nitride film 71 by a further ion implantation as shown in FIG. 16B. Then, p-type and n-type sources/drains are formed in the peripheral circuit region 12, and an interlayer insulating film, various kinds of contact holes, a wiring layer and the like are formed to complete an MNS transistor.

As described above, according to the present invention, a highly reliable MNS transistor can be realized, in which a high quality silicon nitride film 71 is formed by the plasma nitriding method in a low temperature condition, in addition, the silicon nitride film 71 can be utilized as a charge trap film having a charge capture function sufficiently adaptable for a miniaturization and a high integration which are recent demands.

In the charge-storage memory composed of a single layer nitride film, a property as a gate electrode having less interface state between a semiconductor substrate is required with respect to the nitride film. Therefore, the device cannot form without using a plasma nitriding method in existing techniques.

Fifth Embodiment

In the first to fourth embodiments, the charge trap centers are formed by the ion implantation to the silicon nitride film to be a charge trap film, which is formed by the plasma nitriding method, however, in the present embodiment, an RF (radio frequency) processing using an inert gas, for example, an RF sputter etching is performed instead of performing the ion implantation.

As an example, a case including an embedded bit line type memory cell having a SNOS structure is explained in the same way as the third embodiment.

Figure 17:
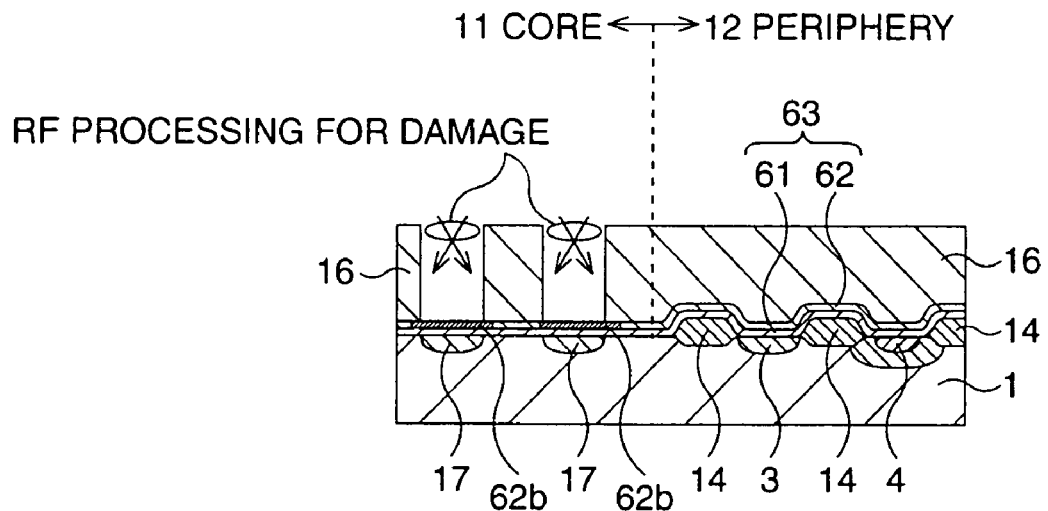
FIG. 17 is a schematic sectional view showing an RF processing in a manufacturing method of a semiconductor memory device according to a fifth embodiment.

FIG. 17 is a schematic sectional view showing an RF process in a manufacturing method of a semiconductor memory device according to the present embodiment.

In the present embodiment, after the respective processes of FIG. 1A, FIG. 1B, and FIG. 9A to FIG. 9C in the same way as the third embodiment, the RF processing is performed using the inert gas such as argon (Ar) or xenon (Xe), an Ar gas in this case, with the resist pattern 16 taken again as a mask, and lattice defects 62b are selectively given to portions corresponding to openings 16a of the resist pattern 16 of a silicon nitride film 62, namely, corresponding to upper portions of bit line diffusion layers 17 of the silicon nitride film 62 to form charge trap centers.

It is desirable to perform the RF processing directly to the exposed silicon nitride film in the manner of the present embodiment, not through a silicon oxide film and the like, because the energy of the RF processing is relatively small.

After that, a semiconductor memory device is completed through respective processes corresponding to the FIG. 2C to FIG. 3A, and FIG. 3B in the same way as the second embodiment.

As described above, according to the present embodiment, a highly reliable semiconductor memory device can be realized, in which the high quality silicon nitride film 22 is formed by the plasma nitriding method in the low temperature condition, in addition, the silicon nitride film 22 can be utilized as a charge trap film having a charge capture function sufficiently adaptable for a miniaturization and a high integration which are recent demands.

In the above-described first to third embodiments and fifth embodiment, when the ONO film or the ON film is formed, it is explained by an example that a surface layer of a silicon oxide film is directly replaced to a silicon nitride film by the plasma nitriding method, however, it is preferable that a silicon film is formed on the silicon oxide film in advance and the silicon film is plasma-nitrified.

Figure 18A:
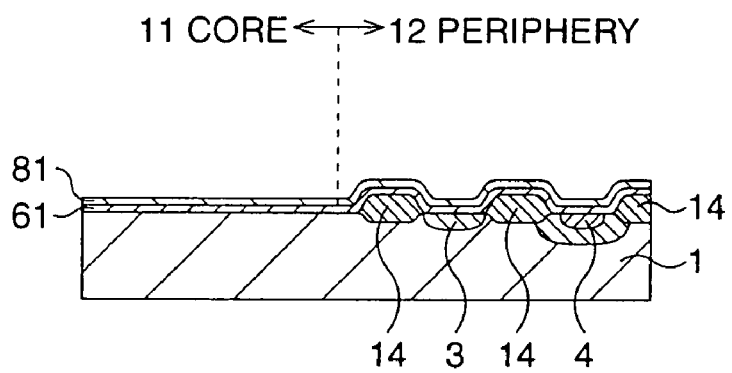
FIG. 18A and FIG. 18B are schematic sectional views showing another forming method of a plasma silicon nitride film according to some embodiments.
Figure 18B:
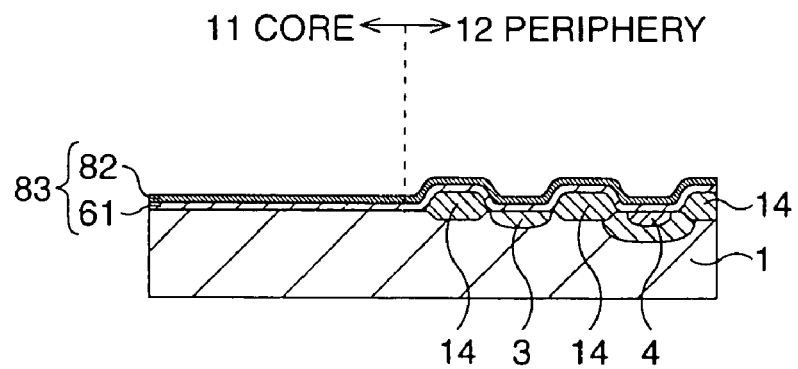

To take the third embodiment as an example, as shown in FIG. 18B, after the lower silicon oxide film 61 to be a tunnel insulating film is formed, an amorphous silicon film 81 having a film thickness of approximately 5 nm is formed on the lower silicon oxide film 61, then, as shown in FIG. 18B, a silicon nitride film 82 to be a charge trap film, of which film thickness is approximately 10 nm is formed as an ON film 83. In this case, it is also preferable to form a polycrystalline silicon film is formed instead of the amorphous silicon film.

Through the first to fifth embodiments, it is explained by examples that the lattice defects are given to the specified portions of the silicon nitride film formed by the aforementioned plasma nitriding method, and the charge trap centers are formed in the specified positions, the present invention is not limited to this and the lattice defects can be given, for example, to almost whole surface of the silicon nitride film, depending on the circumstances.

Non Patent Document 1

IEEE ELECTRON DEVICE LETTERS, VOL. 22, NO. 11, NOVEMBER 2001 "Characterization of Channel Hot Electron Injection by the Subthreshould Slope of NROM™ Device"

INDUSTRIAL APPLICABILITY

According to the present invention, a highly reliable semiconductor memory device can be realized, in which a high quality silicon nitride film is formed in a low temperature condition, in addition, the silicon nitride film can be used as a charge trap film having a charge capture function sufficiently adaptable for a miniaturization and a high integration which are recent demands.

What is claimed is:

1. A manufacturing method of a semiconductor memory device, comprising the steps of:
    forming an insulating film including a nitride film formed on a semiconductor substrate by nothing but a plasma nitriding method or by a series of processes including the plasma nitriding method;
    forming a gate electrode on the insulating film;
    forming a pair of impurity diffusion layers with an impurity introduced into a surface layer of the semiconductor substrate with at least the gate electrode taken as a mask; and
    forming charge trap centers with lattice defects given to portions corresponding to at least on the impurity diffusion layers in the nitride film with at least the gate electrode taken as a mask, before or after the formation of the impurity diffusion layers.

2. The manufacturing method of the semiconductor memory device according to claim 1,
    wherein lattice defects are selectively given only to portions corresponding to on the impurity diffusion layers in the nitride film when the charge trap centers are formed.

3. The manufacturing method of the semiconductor memory device according to claim 1,
    wherein the insulating film is of a single layer structure constituted by nothing but the nitride film.

4. The manufacturing method of the semiconductor memory device according to claim 1,
    wherein the insulating film is a stacked film in which the nitride film is formed on an oxide film.

5. The manufacturing method of the semiconductor memory device according to claim 4,
    wherein the oxide film under the nitride film is formed by one kind or plural kinds of methods selected from a thermal oxidation method, a plasma oxidation method and a thermal CVD oxidation method.

6. The manufacturing method of the semiconductor memory device according to claim 1,
    wherein the insulating film is a stacked film in which the nitride film is sandwiched between respective upper and lower oxide films.

7. The manufacturing method of the semiconductor memory device according to claim 6,
    wherein the oxide film under the nitride film is formed by one kind or plural kinds of methods selected from a thermal oxidation method, a plasma oxidation method and a thermal CVD oxidation method.

8. The manufacturing method of the semiconductor memory device according to claim 1,
    wherein the lattice defects are given by introducing an impurity into the nitride film.

9. The manufacturing method of the semiconductor memory device according to claim 8,
    wherein the impurity is introduced into the nitride film from a direction inclined with respect to the semiconductor substrate.

10. The manufacturing method of the semiconductor memory device according to claim 8,
    wherein the impurity/impurities introduced into the nitride film is/are one kind or combined some kinds selected among silicon, oxygen, nitrogen, argon, fluorosis, boron, phosphorus, arsenic, indium, germanium and antimony.

11. The manufacturing method of the semiconductor memory device according to claim 8,
    wherein the lattice defects are given by performing a radio frequency processing using an inert gas to the nitride film.

* * * * *